(12) United States Patent
Yamada

(10) Patent No.: US 8,792,035 B2
(45) Date of Patent: Jul. 29, 2014

(54) SOLID-STATE IMAGING DEVICE AND MANUFACTURING METHOD THEREOF, DRIVING METHOD OF SOLID-STATE IMAGING DEVICE, AND ELECTRONIC EQUIPMENT

(75) Inventor: Akihiro Yamada, Kanagawa (JP)

(73) Assignee: Sony Corporation (JP)

( * ) Notice: Subject to any disclaimer, the term of this patent is extended or adjusted under 35 U.S.C. 154(b) by 378 days.

(21) Appl. No.: 13/011,522

(22) Filed: Jan. 21, 2011

(65) Prior Publication Data

US 2011/0181749 A1 Jul. 28, 2011

(30) Foreign Application Priority Data

Jan. 29, 2010 (JP) ................... 2010-019598

(51) Int. Cl.
*H04N 3/14* (2006.01)
*H01L 31/062* (2012.01)
*H01L 27/146* (2006.01)

(52) U.S. Cl.
USPC ............ 348/308; 348/307; 257/292; 257/448

(58) Field of Classification Search
CPC .................. H01L 27/14603; H01L 27/14638; H01L 27/14614; H01L 21/823885; H01L 31/2444; H01L 31/022416

USPC .................. 257/488, 291, 292, 448; 348/292, 348/302–310

See application file for complete search history.

(56) References Cited

U.S. PATENT DOCUMENTS

| 2004/0092054 A1 | 5/2004 | Mouli et al. | |
| 2005/0223084 A1 | 10/2005 | Cheng | |
| 2007/0272958 A1* | 11/2007 | Misaki et al. | 257/291 |
| 2008/0277700 A1* | 11/2008 | Kawahito | 257/292 |
| 2009/0303371 A1* | 12/2009 | Watanabe et al. | 348/311 |
| 2010/0002108 A1* | 1/2010 | Mabuchi | 348/294 |

FOREIGN PATENT DOCUMENTS

| JP | 2005-223084 | 8/2005 |
| JP | 2006-506813 | 2/2006 |

* cited by examiner

*Primary Examiner* — Sinh Tran
*Assistant Examiner* — Mark Monk
(74) *Attorney, Agent, or Firm* — Sheridan Ross P.C.

(57) ABSTRACT

A solid-state imaging device includes multiple pixels formed of photoelectric converters and pixel transistors; a floating diffusion portion that exists within a region of each of the photoelectric converters when viewed from above; and a vertical transfer gate electrode of a transfer transistor that surrounds at least a portion of each photoelectric converter and is formed in the depth direction of a substrate and makes up the pixel transistor.

13 Claims, 32 Drawing Sheets

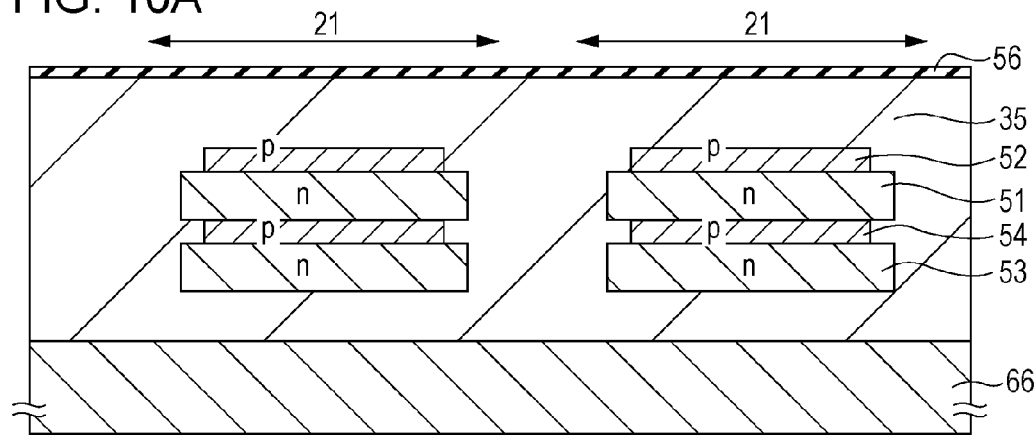
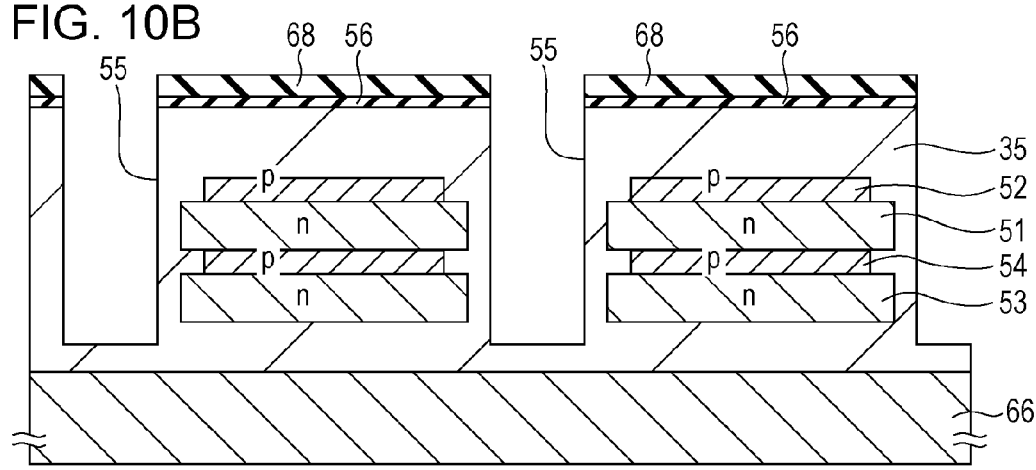
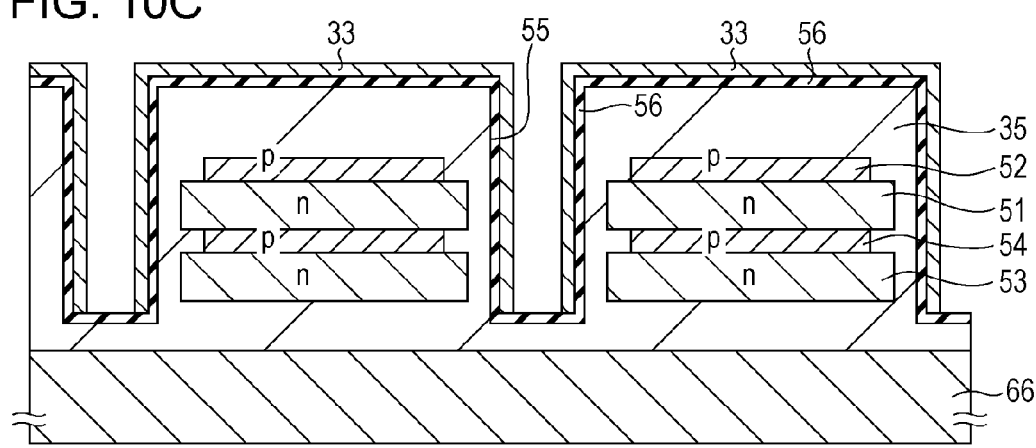

SOLID-STATE IMAGING DEVICE AND MANUFACTURING METHOD THEREOF, DRIVING METHOD OF SOLID-STATE IMAGING DEVICE, AND ELECTRONIC EQUIPMENT

BACKGROUND OF THE INVENTION

1. Field of the Invention

The present invention relates to a solid-state imaging device and manufacturing method thereof, a driving method of a solid-state imaging device, and electronic equipment applied to a camera or the like that has the solid-state imaging device therein.

2. Description of the Related Art

A CMOS solid-state imaging device has been used as a solid-state imaging device. A CMOS solid-state imaging device has low power source voltage and low power consumption, and therefore is used in digital still cameras, digital video cameras, and further various types portable terminal devices such as cellular telephones with built-in cameras.

A CMOS solid-state imaging device is made up of a pixel region wherein multiple pixels that include photodiodes which are photoelectric converters and multiple pixel transistors are arrayed systematically and two-dimensionally, and a peripheral circuit portion that is disposed in the periphery of the pixel region. The peripheral circuit portion has a column circuit (vertical driving unit) to propagate the signals in the column direction and a horizontal circuit (horizontal transfer unit) to transfer the signals from each column propagated by the column circuit and so forth, sequentially to the output circuit. The multiple pixel transistors are often configured as three transistors which are a transfer transistor, reset transistor, and amplifying transistor, or configured as four transistors further including a selection transistor.

Recently, CMOS solid-state imaging devices that enable miniaturizing the pixel size without reducing saturation charge amount (Qs) or sensitivity have been developed (see Japanese Unexamined Patent Application Publication No. 2005-223084). This CMOS solid-state imaging device has a p-n junction of photodiodes formed within the semiconductor substrate, and has a transfer transistor having a vertical transfer gate electrode in the depth direction of the semiconductor substrate. A portion of the p-n junction of the photodiodes are formed so as to extend under the pixel transistors, whereby even if the pixel area is reduces, the area of the photodiodes can be expanded.

Japanese Unexamined Patent Application Publication No. 2006-506813 discloses a device dividing region wherein a polysilicon layer is filled in a substrate, or a polysilicon electrode layer negatively biased via a gate oxide layer is formed on the substrate front face, as device dividing regions. By applying a negative bias, dark current is suppressed.

SUMMARY OF THE INVENTION

Now, with a solid-state imaging device such as described with Japanese Unexamined Patent Application Publication No. 2005-223084, wherein a vertical transfer gate electrode is formed and a photodiode is formed within the substrate, a transfer gate electrode is positioned in the center of the photodiode, and accordingly the photodiode area may not be able to be sufficiently expanded. Therefore, the saturation charge amount may result in being reduced. This tendency becomes more significant as the unit pixel size is reduced, and securing the saturation charge amount becomes markedly difficult. Also, as the unit pixel size is reduced, microfabrication becomes more difficult due to restrictions of the photo resist mask which determines the placement of the vertical transfer transistor.

With a solid-state imaging device such as described in Japanese Unexamined Patent Application Publication No. 2006-506813, wherein the device dividing region is made up of a polysilicon film to which a negative bias is applied, dark current is suppressed to an extent, but the region to which the negative bias is applied is limited, and the suppression of dark current is insufficient.

On the other hand, with a solid-state imaging device, improvement of charge transfer efficiency from the photodiodes to the floating diffusion portion is desired in miniaturization of pixel sizes.

It has been found desirable to provide a solid-state imaging device and manufacturing method thereof and a driving method of solid-state image devices, wherein saturation charge amount is increased, charge transfer efficiency is improved, and dark current is suppressed, even if the pixel size is reduced. It has also been found desirable to provide electronic equipment to be applied to a camera having the solid-state imaging device and so forth.

A solid-state imaging device according to an embodiment of the present invention includes multiple pixels formed of photoelectric converters and pixel transistors, and a floating diffusion portion that exists within a region of each of the photoelectric converters when viewed from above. Further, an embodiment of the present invention has a vertical transfer gate electrode of a transfer transistor that surrounds at least a portion of, and preferably the entirety of, each photoelectric converter and is formed in the depth direction of a substrate and makes up the pixel transistor.

According to the solid-state imaging device according to an embodiment of the present invention, a pixel has a floating diffusion portion within a region making up the photoelectric converters, whereby a large area can be realized for the photoelectric converters. The vertical transfer gate electrode surrounds at least a portion of, and preferable the entirety of, the periphery of the photoelectric converter, whereby charge is transferred to the floating diffusion portion from the periphery. At time of charge accumulation, when applying negative bias voltage to the vertical transfer gate electrode, hole pinning occurs at the interface of the semiconductor region below the vertical transfer gate electrode.

A manufacturing method of a solid-state imaging device according to an embodiment of the present invention includes the steps of: forming photoelectric converters corresponding to each of pixels in a semiconductor well region of a semiconductor substrate; and forming a groove that surrounds each photoelectric converter on the semiconductor substrate. Further, forming of a vertical transfer gate electrode of a transfer transistor that makes up a pixel transistor via a gate insulating film, which surrounds the entire periphery of each photoelectric converter on the inner face of the groove is included. Further, forming of a floating diffusion portion on the semiconductor substrate front face corresponding to the region of the photoelectric converters, as seen from above, is included.

According to the manufacturing method of the solid-state imaging device according to an embodiment of the present invention, a groove surrounding each photoelectric converters are formed, and a vertical transfer gate electrode is formed via a gate insulating firm, whereby a wide area of the groove can be taken, and microfabrication of the vertical transfer gate electrodes is facilitated. Additionally, the floating diffusion portion is formed on the semiconductor front face corresponding to the region of the photoelectric converters, whereby a wide area can be realized for the photoelectric converters. The vertical transfer gate electrode is formed surrounding the floating diffusion portion, whereby at time of charge readout from the photoelectric converters, charge can be transferred from the periphery of the floating diffusion.

A driving method of a solid-state imaging device according to an embodiment of the present invention includes multiple pixels formed of photoelectric converters and pixel transistors and a floating diffusion portion that exists within a region of each of the photoelectric converters when viewed from above, and further includes a vertical transfer gate electrode of a transfer transistor that surrounds a portion or the entirety of each photoelectric converter and is formed in the depth direction of a substrate and makes up the pixel transistor. With an embodiment of the present invention, negative bias voltage is applied to the vertical transfer gate electrode when accumulating charge, and positive bias voltage is applied to the vertical transfer gate electrode at the time of charge transfer.

With the driving method of the solid-state imaging device according to an embodiment of the present invention, a negative bias voltage is applied to the vertical transfer gate electrode, whereby hole pinning occurs at the interface of the semiconductor region below the vertical transfer gate electrode.

Electronic equipment according to an embodiment of the present invention includes a solid-state imaging device, an optical system to guide incident light to a photodiode of the solid-state imaging device, and a signal processing circuit to process output signals from the solid-state imaging device. The solid-state imaging device has multiple pixels made up of photoelectric converters and pixel transistors, and has a floating diffusion portion that exists within a region of each photoelectric converter. Further included is a vertical transfer gate electrode of a transfer transistor that makes up the pixel transistor, which is formed in the depth direction of the substrate surrounding a portion or the entire periphery of each photoelectric converter.

With the electronic equipment according to an embodiment of the present invention, a pixel of the solid-state imaging device has a floating diffusion portion within a region making up the photoelectric converters, whereby a large area of the photoelectric converter can be realized. The vertical transfer gate electrode is formed surrounding at least a portion, or preferably the entirety, of the periphery of the photoelectric converter, whereby charge is transferred to the floating diffusion portion from the periphery. When applying negative bias voltage to the vertical transfer gate electrode at time of charge accumulation, hole pinning occurs at the interface of the semiconductor region below the vertical transfer gate electrode.

With the solid-state imaging device according to an embodiment of the present invention, even if the pixel size is reduced a large area of the photoelectric converter can be realized, whereby saturation charge amount can be increased. Charge is transferred from the periphery to the floating diffusion portion when transferring charge from the photoelectric converter, whereby charge can be transferred efficiently. Negative bias voltage can be applied to the vertical transfer gate electrode, and hole pinning occurs at the interface of the semiconductor region below the vertical transfer gate electrode by the negative bias voltage at time of charge accumulation, whereby dark current can be suppressed.

With the manufacturing method of the solid-state imaging device according to an embodiment of the present invention, even if the pixel size is reduced, microfabrication of the vertical transfer gate electrodes is facilitated. A solid-state imaging device wherein the saturation charge amount is increased, charge transfer efficiency improved, and dark current suppressed can be readily and accurately manufactured.

With the driving method of the solid-state imaging device according to an embodiment of the present invention, dark current can be suppressed for a solid-state imaging device having the pixel configuration described above.

With the electronic equipment according to an embodiment of the present invention, the above described solid-state imaging device can be provided, whereby electronic equipment having high sensitivity and high image quality can be obtained, and electronic equipment having high reliability can be provided.

BRIEF DESCRIPTION OF THE DRAWINGS

FIGS. 10A through 10C are manufacturing process diagrams (part 1) of a first manufacturing method example of the solid-state imaging device according to the first embodiment;

DESCRIPTION OF THE PREFERRED EMBODIMENTS

Embodiments of the present invention will be described below. Note that description will be given in the following order.

1. Overall configuration example of MOS solid-state imaging device.
2. First embodiment (Configuration Example of Solid-State Imaging Device and Manufacturing Method)
3. Second embodiment (Configuration Example of Solid-State Imaging Device)
4. Third embodiment (Configuration Example of Solid-State Imaging Device)
5. Fourth embodiment (Configuration Example of Solid-State Imaging Device)
6. Fifth embodiment (Configuration Example of Solid-State Imaging Device)
7. Sixth embodiment (Configuration Example of Solid-State Imaging Device)
8. Seventh embodiment (Configuration Example of Solid-State Imaging Device)
9. Eighth embodiment (Configuration Example of Solid-State Imaging Device)
10. Ninth embodiment (Configuration Example of Solid-State Imaging Device)
11. Tenth embodiment (Configuration Example of Solid-State Imaging Device)
12. Eleventh embodiment (Configuration Example of Electronic Equipment)

1. Overall Configuration Example of CMOS Solid-State Imaging Device

Figure 1:
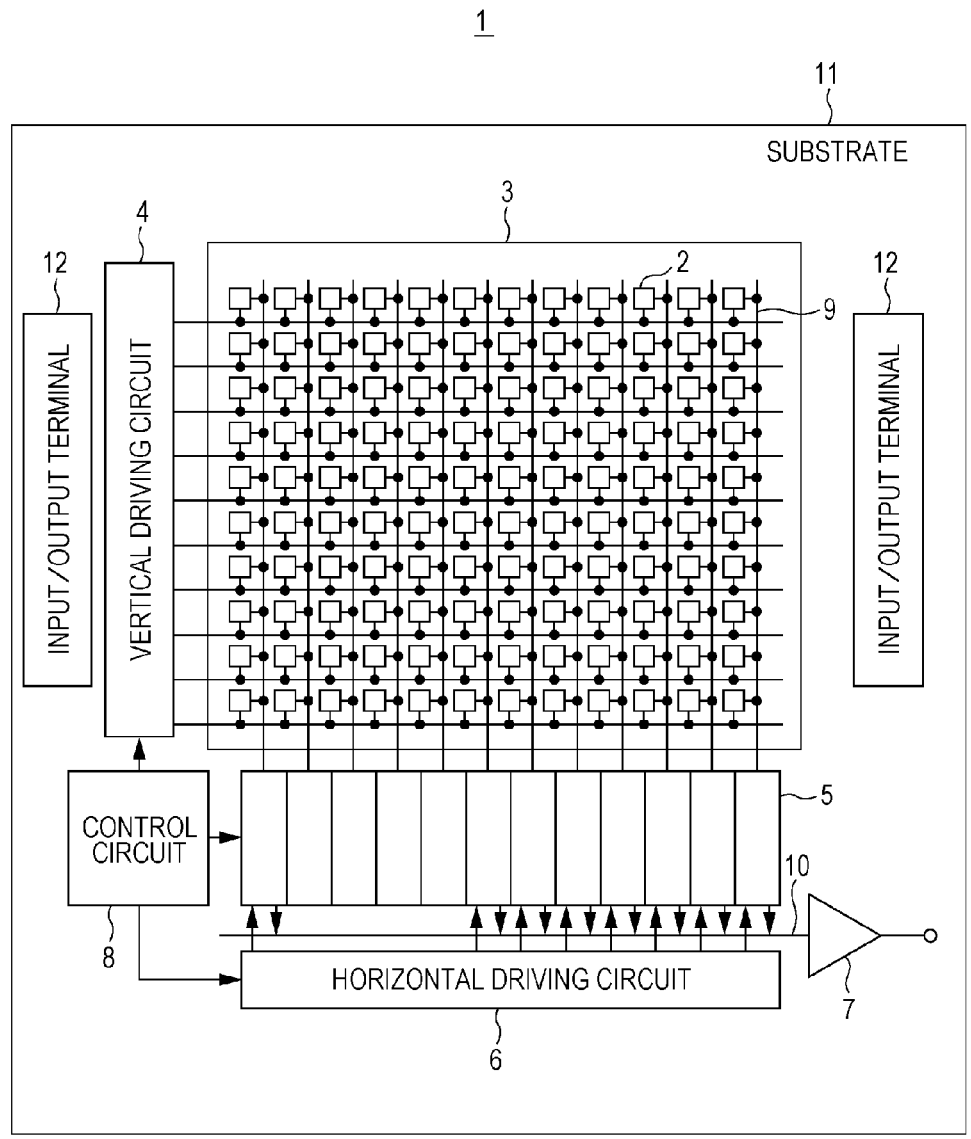
FIG. 1 is a schematic configuration diagram of a CMOS solid-state imaging device applicable to a solid-state imaging device according to an embodiment of the present invention.

FIG. 1 shows an overall configuration of an example of a MOS solid-state imaging device applied to various embodiments of the present invention. As shown in FIG. 1, a solid-state imaging device 1 in the present example is made up of a pixel region (also called an imaging region) 3 wherein multiple pixels 2 which include photoelectric converters are arrayed systematically and two-dimensionally on a semiconductor substrate 11, e.g. a silicon substrate, and a peripheral circuit portion. A unit pixel made up of one photoelectric converter and multiple pixel transistors can be used as the pixel 2. Also, a pixel-sharing configuration, wherein multiple photoelectric converters share other pixel transistors excluding transfer transistors, can be used as the pixel 2. The multiple pixel transistors can be made up of three transistors or four transistors, as mentioned in the Description of the Related Art.

The peripheral circuit portion is made up of a vertical driving circuit 4, column signal processing circuit 5, horizontal driving circuit 6, output circuit 7, control circuit 8, and so forth.

The control circuit 8 receives an input clock and data that instructs the operation mode, and outputs data such as internal information of the solid-state imaging device. That is to say, with the control circuit 8, clock signals and control signals serving as a reference for operating the vertical driving circuit 4, column signal processing circuit 5, and horizontal driving circuit 6 and so forth, are generated based on vertical synchronizing signals, horizontal synchronizing signals, and a master clock. The signals herein are input into the vertical driving circuit 4, column signal processing circuit 5, and horizontal driving circuit 6 and so forth.

The vertical driving circuit 4 is made up of shift registers for example, and selects a pixel driving line, supplies a pulse for driving the pixel to the selected pixel driving line, and drives the pixels in increments of rows. That is to say, the vertical driving circuit 4 selectively drives each pixel 2 in the pixel region 3 in the vertical direction sequentially in increments of rows. A pixel signal based on signal charge generated according to the received light amount in a photodiode for example serving as the photoelectric converter of the pixels 2 is supplied to the column signal processing circuit 5 through a vertical signal line 9.

The column signal circuit 5 is arrayed in columns for example of the pixels 2, and performs signal processing such as noise removal for each pixel column as to the signal output from one row of pixels 2. That is to say, the column signal processing circuit 5 performs signal process such as CDS to remove solid-state pattern noise unique to the pixel 2, signal amplification, AD conversion, and so forth. A horizontal selection switch (unshown) is provided so as to be connected between the horizontal lines 10 on the output state of the column signal processing circuit 5.

The horizontal driving circuit 6 is made up of shift registers for example, each of the column signal processing circuits 5 are sequentially selected by sequentially outputting a horizontal running pulse, and the pixel signal is output to the horizontal signal line 10 from each of the column signal processing circuits 5.

The output circuit 7 performs signal processing and outputs as to the signals sequentially supplied from each of the column signal processing circuits 5 through the horizontal signal lines 10. For example, in some cases only buffering is performed, and in other cases black level adjusting, column scattering correction, and various types of digital signal processing or the like are performed. The input/output terminal 12 exchanges signals externally.

Figure 2:
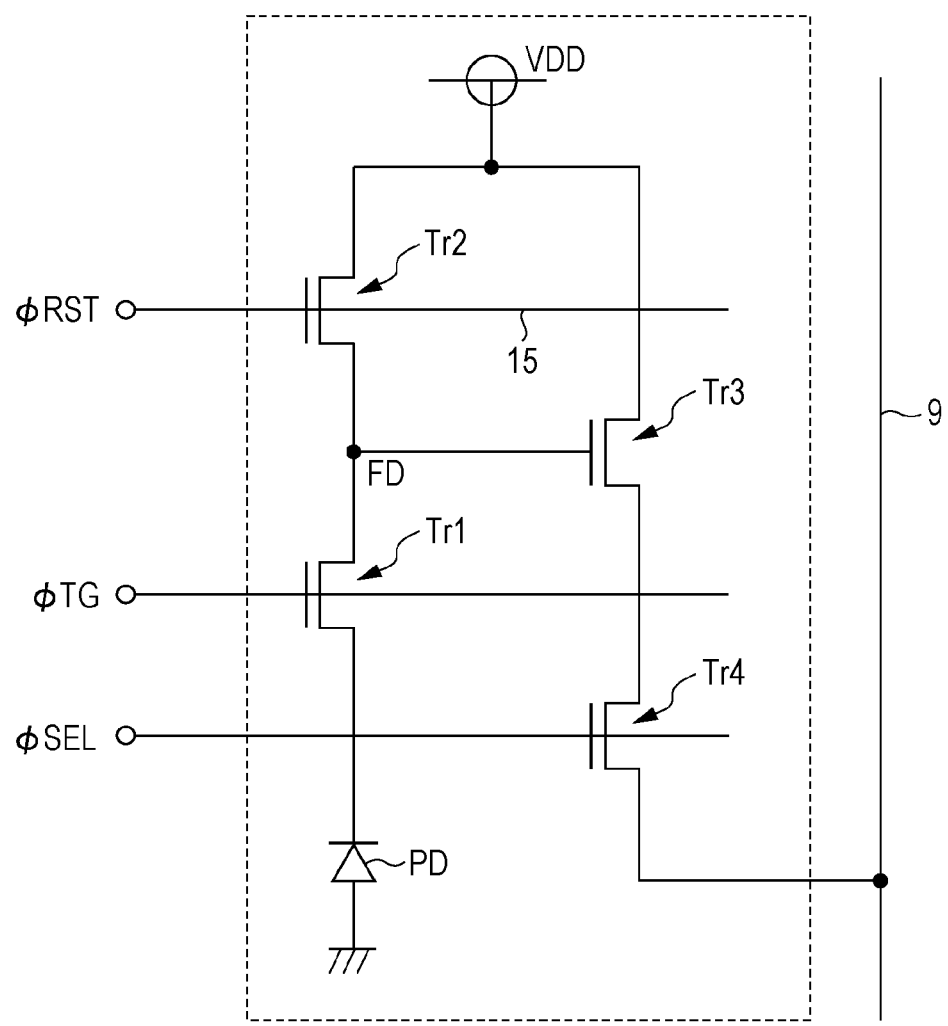
FIG. 2 is an equivalent circuit diagram of an example of a unit pixel.

FIG. 2 is an equivalent circuit diagram with a unit pixel 21. The unit pixel 21 relating to the present example is made up of a photodiode PD serving as a photoelectric converter and four pixel transistors. The four pixel transistors are made up of a transfer transistor Tr1, reset transistor Tr2, amplifying transistor Tr3, and selection transistor Tr4. Now, n-channel MOS transistors for example are used as the pixel transistors Tr1 through Tr4.

The photodiode PD is connected to the transfer transistor Tr1. The transfer transistor Tr1 is connected to the reset transistor Tr2 via a floating diffusion portion FD. A signal charge (in this case, electrons) that has been photoelectrically converted with the photodiode PD and accumulated here is transferred to the floating diffusion portion FD by a transfer pulse φTRG being provided to the gate of the transfer transistor Tr1.

The floating diffusion portion FD is connected to the gate of the amplifying transistor Tr3. The drain of the amplifying transistor Tr3 and the drain of the reset transistor Tr2 are connected to a power source VDD. Now the source (drain of the transfer transistor Tr1) of the reset transistor Tr2 is made up as a floating diffusion portion FD. The potential of the floating diffusion portion FD is reset in advance of signal charge being transferred from the photodiode PD to the floating diffusion portion FD, by a reset pulse φRST being provided to the reset gate.

The source of the amplifying transistor Tr3 is connected to the drain of the selection transistor Tr4, and the source of the selection transistor is connected to the vertical signal line 9. A selecting pulse φSEL is provided to the gate of the selection transistor Tr4 whereby the gate goes to the on state, and a pixel 2 is selected. The amplifying transistor Tr3 outputs the potential of the floating diffusion portion FD after having been reset by the reset transistor Tr2 to the vertical signal line 9 via the selection transistor Tr4, as a reset level. Further, the amplifying transistor Tr3 outputs the potential of the floating diffusion portion FD after having transferred the signal charge with the transfer transistor Tr1 to the vertical signal line 9 via the selection transistor Tr4, as a signal level. Note that the selection transistor 115 can take a configuration of being connected between the power source VDD and the drain of the amplifying transistor Tr3. At this time, the drain of the amplifying transistor Tr3 is connected to the vertical signal line 9.

Figure 3:
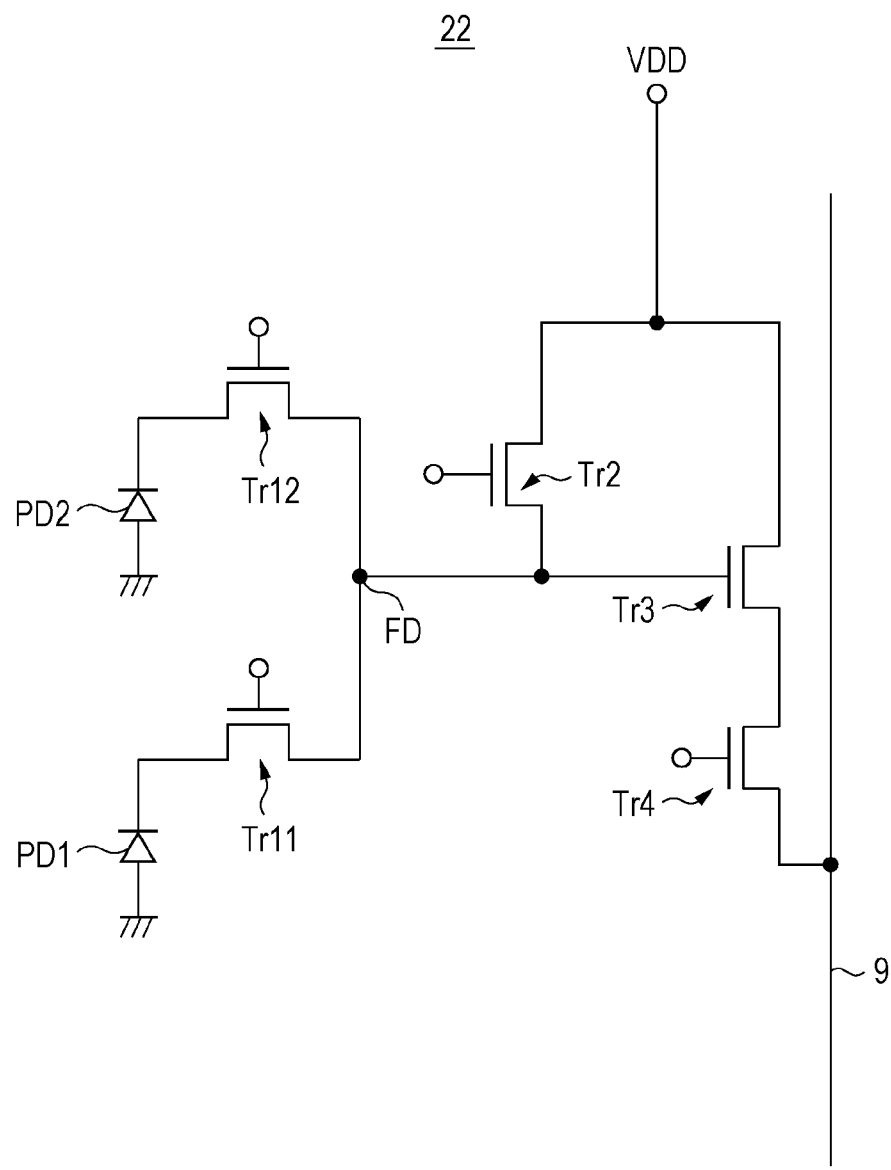
FIG. 3 is an equivalent circuit diagram of a unit pixel group that is common between two pixels.

FIG. 3 shows an equivalent circuit of a unit pixel group 22 that two pixels share. The unit pixel group 22 relating to the present example is configured such that one pixel transistor portion is shared between photodiodes PD (PD1, PD2) which serve as two photoelectric converters. That is to say, the unit pixel group 22 is made up of four photodiodes PD, two transfer transistors Tr11 and Tr12, and one floating diffusion FD, reset transistor Tr2, amplifying transistor Tr3, and selection transistor Tr4. Each transfer transistor Tr11 and Tr12 is connected to a reset transistor Tr2 via the shared floating diffusion portion FD, and the floating diffusion portion FD is connected to the gate of the amplifying transistor Tr3. The drain of the reset transistor Tr2 and the drain of the amplifying transistor Tr3 are connected to the power VDD, and the source of the amplifying transistor Tr3 is connected to the drain of the selection transistor Tr4. The source of the selection transistor Tr4 is connected to a vertical signal line 9. A transfer pulse is applied to the gate of each transfer transistor Tr11 and Tr12, a reset pulse is applied to the gate of the reset transistor Tr2, and a selection pulse is applied to the gate of the selection transistor Tr4.

2. First Embodiment

Configuration Example of Solid-State Imaging Device and Manufacturing Method

Figure 4:
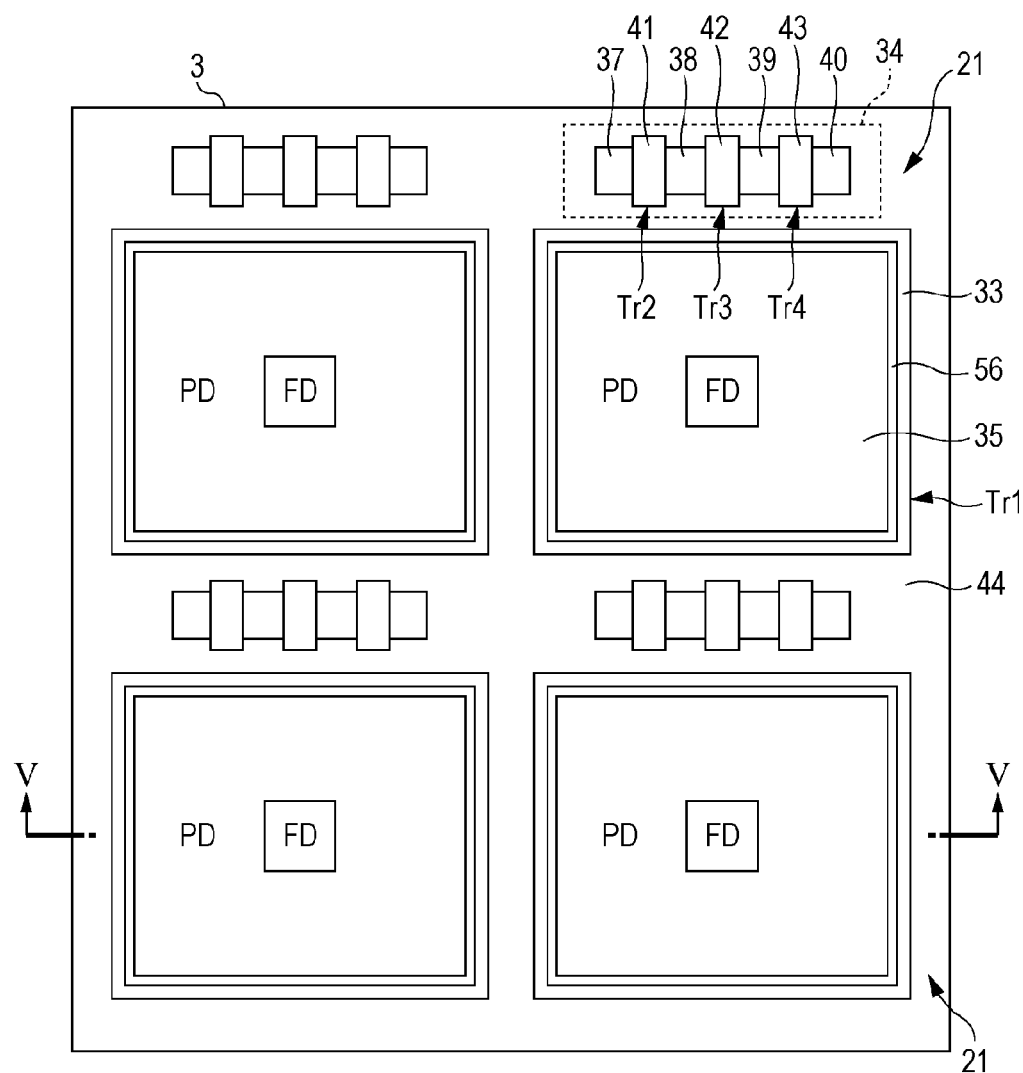
FIG. 4 is a schematic plan view of the primary portions illustrating a first embodiment of the solid-state imaging device according to an embodiment of the present invention.
Figure 5:
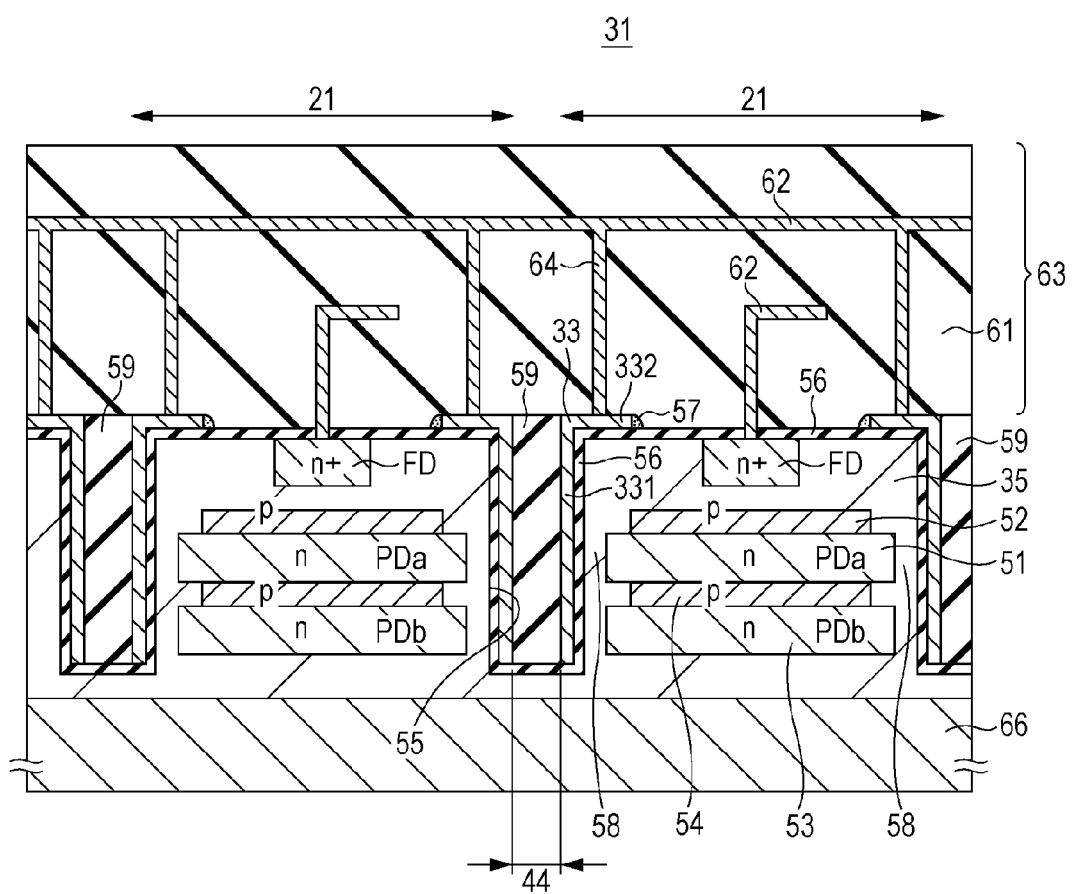
FIG. 5 is a schematic cross-sectional view along line V-V in FIG. 4.

FIGS. 4 and 5 show a first embodiment of a solid-state imaging device relating to the present invention. The present embodiment is a case that is applied to a CMOS solid-state imaging device with unit pixels 21 arrayed. FIG. 4 is a schematic plan view of the primary portions of the pixel region 3, and FIG. 5 is a schematic cross-sectional view along line V-V in FIG. 4.

A solid-state imaging device 31 relating to the first embodiment has multiple unit pixels 21 made up of photodiodes PD serving as photoelectric converters and pixel transistors arrayed on the pixel region 3, as shown in FIG. 4. With each unit pixel 21, a floating diffusion portion FD is formed so as to exist within the region making up the photodiodes PD viewed from above, and vertical transfer gate electrodes 33 of the transfer transistor Tr1 surround the entire periphery of each photodiode PD. Reference numeral 34 denotes the pixel transistor region. According to the present example, the floating diffusion portion FD is formed in the center of the region corresponding to the photodiode PD. Single or multiple photodiodes PD are formed in the depth direction within a semiconductor substrate 35. According to the present example, as shown in FIG. 5, two photodiodes PDa and PDb are formed in the depth direction in a layered manner.

A reset transistor Tr2, amplifying transistor Tr3, and selection transistor Tr4 are formed on the pixel transistor region 34 of each unit pixel 21. The reset transistor Tr2 is made up of a pair of extrinsic semiconductor regions 37 and 38 serving as a source and drain, and for example a polysilicon reset gate electrode 41. The amplifying transistor Tr3 is made up of a pair of extrinsic semiconductor regions 38 and 39 serving as a source and drain, and for example a polysilicon amplifying gate electrode 42. The selection transistor Tr4 is made up of a pair of extrinsic semiconductor regions 39 and 40 serving as a source and drain, and for example a polysilicon selection gate electrode 43.

A device dividing region 44 for device division of the various unit pixels 21 is formed between adjacent unit pixels 21. The device dividing region 44 can be made up of an insulated device dividing region formed by imbedding an insulating film into a groove, for example. Alternatively, the device dividing region 44 can be made up of a dopant dispersion region via an insulating film within a groove.

Using the cross-sectional diagram in FIG. 5, the cross-sectional configuration of the unit pixel 21 along line V-V will be described. A first conductivity type, e.g. n-type, semiconductor substrate or a second conductivity type, e.g. p-type, semiconductor substrate can be used as the semiconductor substrate 35. The semiconductor substrate 35 can also be replaced by a semiconductor well region. According to the present example, a first and second photodiode PDA and PDb of each unit pixel 21 is formed on the n-type semiconductor substrate 35. The first photodiode PDa forms a p-n junction with an n-type semiconductor region 51 serving as a charge accumulating region and a p-type semiconductor region 52 thereabove. The second photodiode PDb forms a p-n junction with an n-type semiconductor region 53 serving as a charge accumulating region and a p-type semiconductor region 54 thereabove.

The first and second photodiodes PDa and PDb are embedded in the semiconductor substrate 35 in the depth direction, and are layered so that the p-type semiconductor regions 51 and 53 are on the substrate front face side.

On the other hand, a groove 55 reaching a depth position of the second photodiode PDb from the substrate front face is formed so as to surround the photodiodes PD (PDa, PDb) of each unit pixel 21. A gate insulating film 56 of a silicon oxide film or the like is formed from the inner face of the groove 55, over the substrate front face, for example, and further, a transfer gate electrode 33 is formed on the gate insulating film 56 of the inner wall face of the groove 55. The transfer gate electrode 33 is divided for each unit pixel 21 and formed so as to surround the photodiodes PD (PDa, PDb). The transfer gate electrode 33 is formed so as to extend from the groove inner wall face to a portion of the semiconductor substrate front face.

The vertical transfer gate electrode 331 is made up of the gate electrode 33 formed on the inner wall face of the groove 55. Also, a horizontal transfer gate electrode 332 is made up of the gate electrode continuing from the vertical transfer gate electrode 33 and extending along the substrate front face side. A sidewall 57 made of an insulating film is formed on the side portion of the horizontal transfer gate electrode 332.

A floating diffusion portion FD made up of an n-type semiconductor region is formed on the front face of the semiconductor substrate 35 corresponding to the regions of the photodiodes PD (PDa, PDb) of each unit pixel 21. The floating diffusion portion FD is formed in the center of the region making up the photodiodes PD, when viewed from above.

The n-type semiconductor regions 51 and 53 of the first and second photodiodes PDa and PDb have an area wider than the p-type semiconductor regions 52 and 54, which is formed below the vertical transfer gate electrode 331, i.e. adjacent to a channel region 58 corresponding to the groove wall face. The channel region 58 can be formed with an n-region of a low dopant concentration or a p-region.

The center portion of the groove 55, wherein the vertical transfer gate electrode 331 is formed on the inner wall face, has an insulating layer 59 for example filled in to form a device dividing region 44. That is to say, a device dividing region 44 is formed between the vertical transfer date electrodes 331 of adjacent pixels. The reset transistor Tr2, amplifying transistor Tr3, and selection transistor Tr4 are formed on a p-type semiconductor well region that is formed on the front face side of the semiconductor substrate 36 although not shown. On the front face of the semiconductor substrate 35, a wiring layer 63 in which multiple layers of lines 62 are arrayed is formed, with an intra-layer insulating film 61 introduced therebetween. Appropriate lines 62 are connected to appropriate portions of the unit pixels 21 via a semiconductor plug 64.

With the above-described photodiodes PDa and PDb, the photodiodes PDa and PDb are divided by the p-type semiconductor region 54. In the case that multiple photodiodes are layered together, the photodiodes PD are divided by layer by the p-type semiconductor region of the photodiodes PD. However, this configuration is not restricted to inclusion of this p-type semiconductor region.

The floating diffusion portion FD and the photodiode PDa are divided by the p-type semiconductor region 52 of the photodiode PDa.

The p-type semiconductor regions 52 and 54 of the photodiodes PDa and PDb layered in the depth direction of the substrate are formed so as to be sufficiently separated from the groove wall face forming the channel region 58 below the vertical transfer gate electrode 331. Thus, at the time of charge accumulation, the charge that is accumulated in the n-type semiconductor region which is the charge accumulation region of one of the photodiodes PD can freely move to the n-type semiconductor region which is the charge accumulation region of the other photodiode PD.

Next, the operation (driving method) of the solid-state imaging device 31 relating to the first embodiment will be described. At the time of charge accumulation, the charge (in this case, electrons) that is generated by incident light having been photoelectrically converted is accumulated in one of the n-type semiconductor regions 52 and 54 which are charge accumulating regions of the photodiodes PD (PDa, PDb) according to the grade of the potential. The charge accumulated in the photodiode PDa or PDb can freely transit between the photodiodes PDa and PDb. In the case that excessive accumulation is in one of the photodiodes PD, the excess charge thereof is transferred to the other photodiode PD. For example, in the case that an excessive amount of charge is accumulated in the n-type semiconductor region 52 of the photodiodes PDa, the excess charge is transferred to the n-type semiconductor region 54 of the other photodiode PD through the space between the channel region 58 below the vertical transfer gate electrode 331 and the p-type semiconductor region 54. The opposite thereof may also be the case. At the time of charge accumulation, it is preferable for a negative bias voltage to be applied to the transfer gate electrode 33 (331, 332). With this negative bias voltage, holes are accumulated in the channel region 58 below the transfer gate electrode 33 (331, 332), and so-called hole pinning occurs to suppress dark current.

Figure 6A:
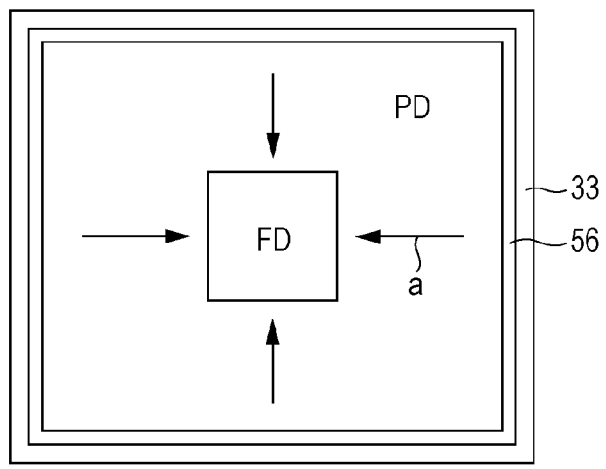
FIGS. 6A and 6B are a schematic plan view and schematic cross-sectional view for operational description of the solid-state imaging device according to a first embodiment.
Figure 6B:
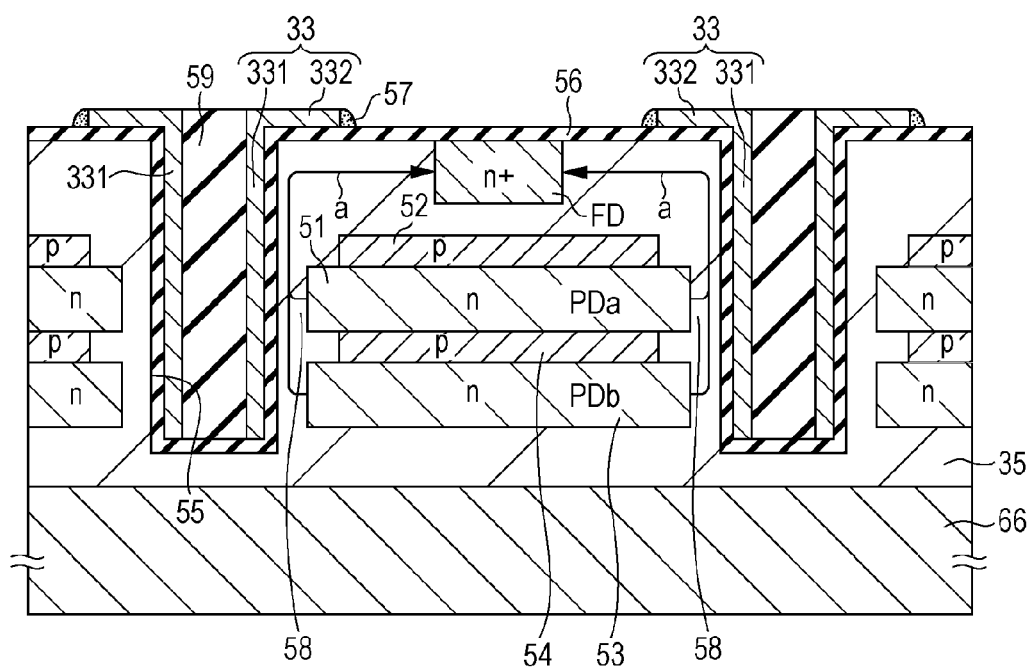

At the time of charge transferring when reading out the signal charge and so forth, positive voltage is applied to the transfer gate electrode 33 (331, 332) and the transfer transistor Tr1 is turned on. At this time, the charge accumulating region of the photodiodes PD surrounded by the vertical transfer gate electrode 331 is modulated, and potential gradient occurs towards below the vertical transfer gate electrode 331. The charge accumulated in the charge accumulating region according to the potential gradient thereof is transferred to below the vertical transfer gate electrode 331. Subsequently, the charge is transferred to the floating diffusion portion FD through the channel region 58 formed below the vertical transfer gate electrode 331 and horizontal transfer gate electrode 332. That is to say, the charge accumulated in the n-type semiconductor regions 52 and 54 of the photodiodes PDa, PDb is transferred to the floating diffusion portion FD through the channel region 58 below the vertical transfer gate electrode 331 and horizontal transfer gate electrode 332, as shown by the arrow a in FIG. 6B. At this time, the vertical transfer gate electrode 331 and horizontal transfer gate electrode 332 surround the floating diffusion portion FD in the center, whereby the charge is transferred from the periphery to the floating diffusion portion FD, as shown by the arrow a in FIG. 6A. By the floating diffusion portion FD existing in the center, the entire charge is transferred from the periphery to the floating diffusion portion FD in the shortest distance, whereby charge transfer efficiency is improved.

Figure 7:
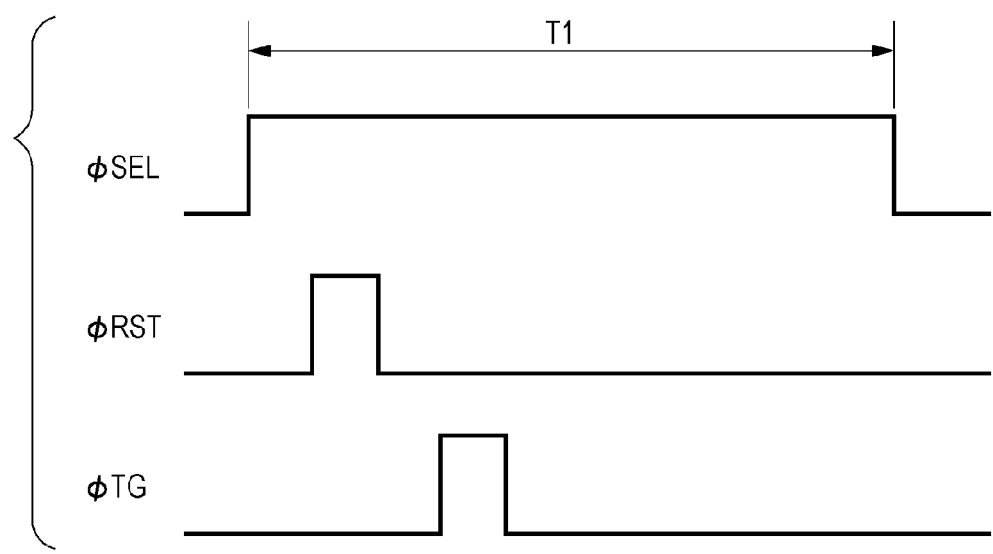
FIG. 7 is a timing chart of a driving pulse applied to the first embodiment.

With the solid-state imaging device according to embodiments of the present invention, the sharing method of the unit pixels and pixels can be freely modified according to wiring layout, and the pixel transistor can also correspond to either the three transistor type or the four transistor type. Therefore, while applicable to any driving method, an example of a driving method of the timing chart which is a basic operation of the unit pixel is shown in FIG. 7.

During a period T1 of reading out one row of pixels by applying the selection pulse φSEL, the selection transistor Tr4 is maintained in the on state. A reset pulse φRST is applied to the reset gate of the reset transistor Tr2, and the charge of the floating diffusion portion FD is reset. After the resetting, a transfer pulse φTG is applied to the transfer gate of the transfer transistor Tr1 and the signal charge of the pixel is read out.

According to the solid-state imaging device 31 relating to the first embodiment, the vertical transfer gate electrode 331 is formed so as to surround the photodiode PD, and the floating diffusion portion FD is disposed within the region corresponding to the photodiode PD. Accordingly, the area of the photodiode PD is increased, and the saturation charge amount increases. That is to say, even is the pixel size is reduced, the saturation charge amount can be increased, improving sensitivity. By layering multiple layers of photodiodes PD in the depth direction, the saturation charge amount for each unit pixel can be further increased, further improving sensitivity.

The charge is transferred from the periphery of the floating diffusion portion FD to the floating diffusion portion FD, whereby the transfer path of the charge becomes the shortest distance, and accordingly charge transfer efficiency can be improved. By applying negative bias voltage to the transfer gate electrode 33 (331, 332) when accumulating charge, dark current can be suppressed.

Figure 8:
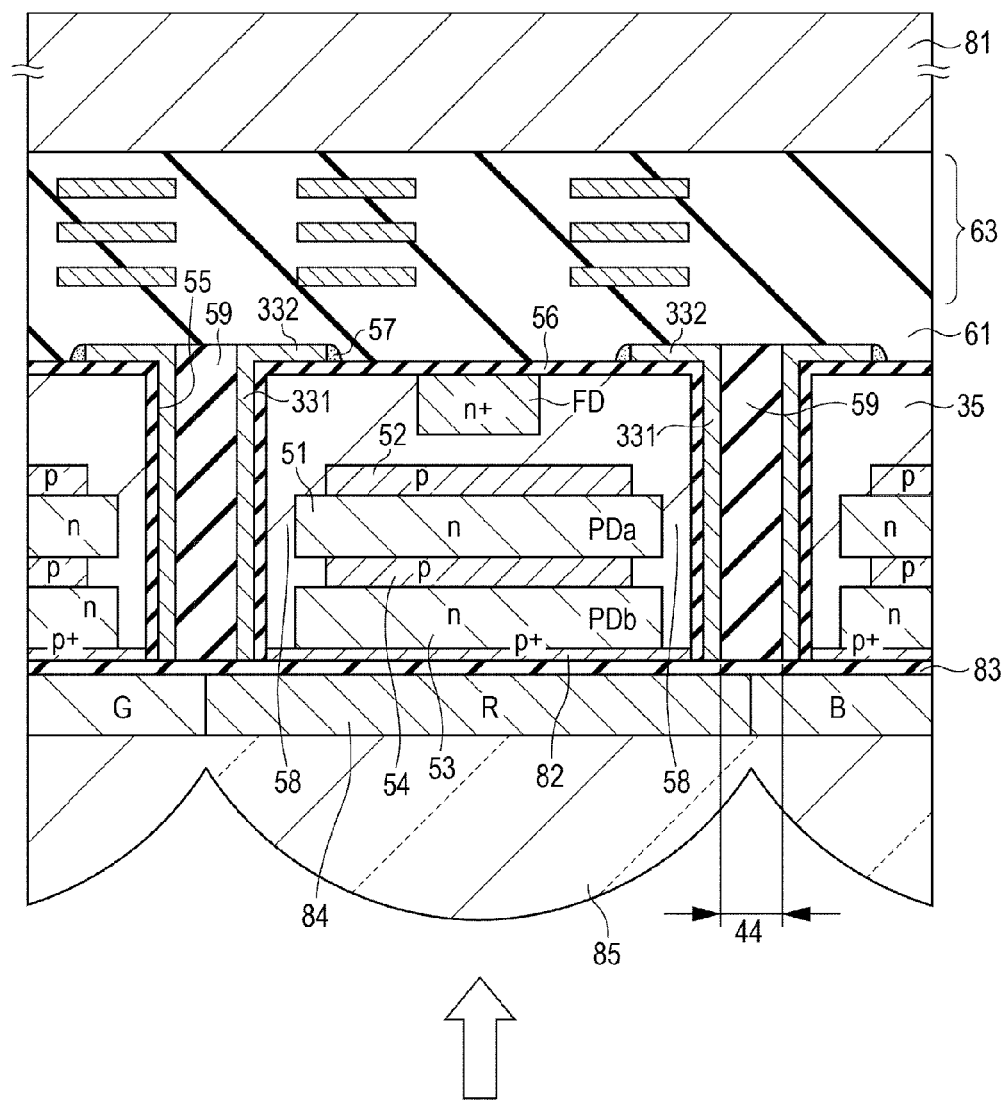
FIG. 8 is a schematic cross-sectional diagram of the primary portions in the case of applying the solid-state imaging device according to the first embodiment to a backside illuminated solid-state imaging device.

FIG. 8 shows an example of applying the solid-state imaging device 31 of the first embodiment to a backside illuminated solid-state imaging device. A backside illuminated solid-state imaging device 311 according to the present example has two layers of photodiodes PDa and PDb within the semiconductor substrate 35, similar to that described above, as well as a vertical transfer gate electrode 331 and horizontal transfer gate electrode 332 so as to surround these. The floating diffusion portion FD of each unit pixel 21 is formed on the substrate front face corresponding to the center of the photodiodes PDa PDb regions. A device dividing region 44 that divides the various unit pixels 21 is formed. A wiring layer 63 is formed on the substrate front face whereupon multiple layers of lines 62 are disposed, and for example a supporting substrate 81 made of a silicon substrate or the like is adhered on top of the wiring layer 63. On the other hand, a p-type semiconductor region 82 for suppressing dark current is formed on the substrate back face of each unit pixel 21, and a color filter 84 and on-chip lens 85 are sequentially formed via the insulating film 83 on the back face of the substrate. The configuration of the other portions are similar to those described according to the first embodiment, so portions corresponding to FIG. 5 are denoted with the same reference numerals, and redundant description will be omitted.

According to a backside illuminated solid-state imaging device 311 of the present example, similar to the above description, even if the pixel size is reduced, the saturation charge amount can be increased, transfer efficiency to the charge floating diffusion portion FD improved, and dark current at the time of charge accumulation suppressed. Since this is a backside illuminated, sensitivity is improved as compared to a frontside illuminated.

Figure 9:
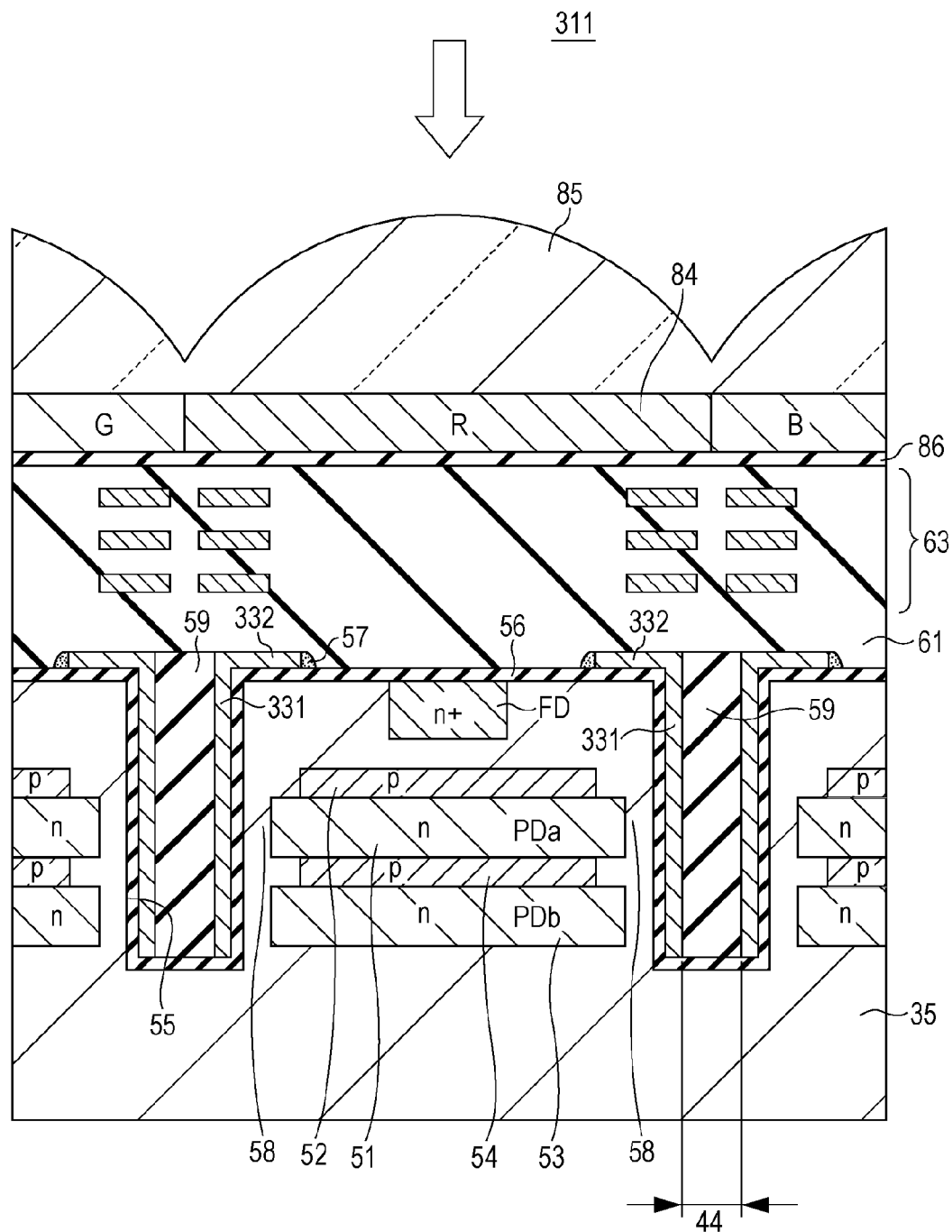
FIG. 9 is a schematic cross-sectional diagram of the primary portions in the case of applying the solid-state imaging device according to the first embodiment to a frontside illuminated solid-state imaging device.

FIG. 9 shows an example of applying the solid-state imaging device 31 of the first embodiment to a frontside illuminated solid-state imaging device. As with the above description, the frontside illuminated solid-state imaging device 312 according to the present example has two layers of photodiodes PDa and PDb and a vertical transfer gate electrode 331 and horizontal transfer gate electrode 332 so as to surround these, within the semiconductor substrate 35. The floating diffusion portion FD of each unit pixel 21 is formed on the substrate front face corresponding to the center of the photodiodes PDa PDb regions. A device dividing region 44 that divides the various unit pixels 21 is formed. A wiring layer 63 is formed on the substrate front face, whereupon multiple layers of lines 62 are disposed, and the lines 62 are formed except for on the photodiodes PDa and PDb. A color filter 84 and on-chip lens 85 are sequentially formed on the wiring layer 63 via a flat film 86 of an insulating film. The configuration of the other portions are similar to those described according to the first embodiment, so portions corresponding to FIG. 5 are denoted with the same reference numerals, and redundant description will be omitted.

According to the frontside illuminated solid-state imaging device 31 of the present example, similar to the above description, even if the pixel size is reduced, the saturation charge amount can be increased, transfer efficiency to the charge floating diffusion portion FD improved, and dark current at the time of charge accumulation suppressed. Since this is a backside illuminated, sensitivity is improved as compared to a frontside illuminated.

Manufacturing Method Example 1 of Solid-State Imaging Device

Next, a first example of a manufacturing method of the above-mentioned solid-state imaging device 31 is shown in FIGS. 10A through 13.

First, as shown in FIG. 10A, an n-type semiconductor well region 35 having a relatively low dopant concentration is formed on a silicon semiconductor substrate 66. A first and second photodiode PDa and PDb are formed embedded in the n-type semiconductor well region 35 and layered in the substrate depth direction. The first photodiode PDa has an n-type semiconductor region 51 and p-type semiconductor region 52 serving as charge accumulating regions. The second photodiode PDb has an n-type semiconductor region 53 and p-type semiconductor region 54 serving as charge accumulating regions. The photodiodes PD (PDa, PDb) are each formed on a region corresponding to the unit pixels 21. The photodiode PD is formed by ion implantation via a mask such as a resist mask or the like. A gate insulating film (silicon oxide film) 56 is formed on the front face of the semiconductor substrate 66 by thermal oxidation.

Next, as shown in FIG. 10B, a hard mask 68 made of an insulating film having a different etching rate from the gate insulating film 56 and the silicon substrate 66 thereunder is formed on the gate insulating film 56. Dry etching is performed via the hard mask 68, and a groove 55 that reaches the depth position of the second photodiode PDb from the substrate front face is formed so as to divide the unit pixels 21. The groove 55 is formed so as to surround the entire periphery of the first and second photodiodes PDa and PDb.

Next, as shown in FIG. 10C, a gate insulating film 56 is formed on the inner wall face of the groove 55 by thermal oxidation. Next, after the hard mask 68 is removed, a transfer gate electrode 33 of the transfer transistor Tr1 is formed on the gate insulating film 56 on the groove inner wall face (entire inner wall) and substrate front face. The transfer gate electrode 33 can be made of a polysilicon film, copper film, or aluminum film doped with a dopant, for example.

Figure 11D:
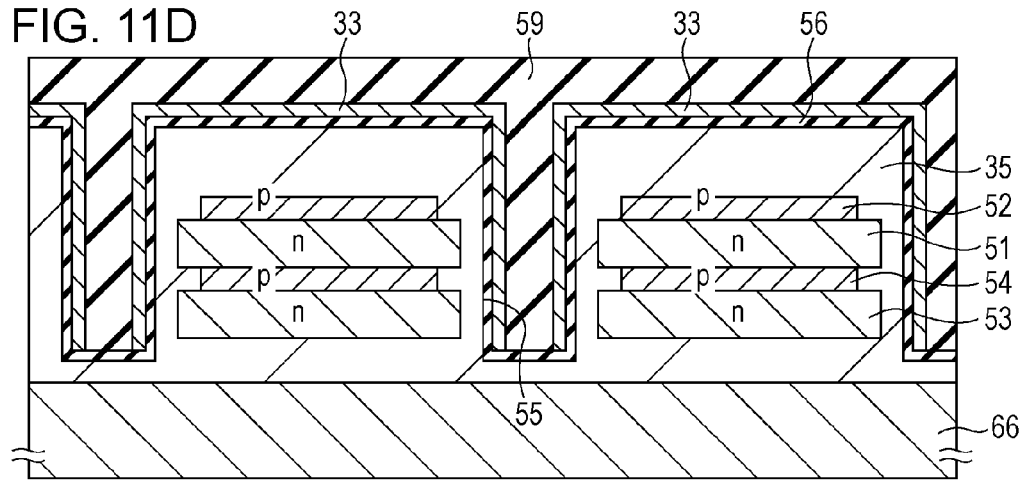
FIGS. 11D through 11F are manufacturing process diagrams (part 2) of a first manufacturing method example of the solid-state imaging device according to the first embodiment.

Next, as shown in FIG. 11D, only the transfer gate electrode 33 on the bottom face of the groove 55 is selectively removed by dry etching, and the transfer gate electrode 33 that surrounds the photodiode PD (PDa, PDb) of the unit pixels 21 is divided for each unit pixel. The dry etching herein is performed with the gate insulating film 56 on the bottom face of the groove 55 as a stopping film. Next, the insulating film 59 made of a silicon oxide film for example is formed on the substrate front face so as to fill in the groove 55. The insulating film 59 herein can be formed by chemical vapor deposition (CVD), for example. That is to say, the insulating film 59 herein is for dividing devices, and fills in between the vertical transfer gate electrodes 331 in adjacent pixels as described later.

Figure 11E:
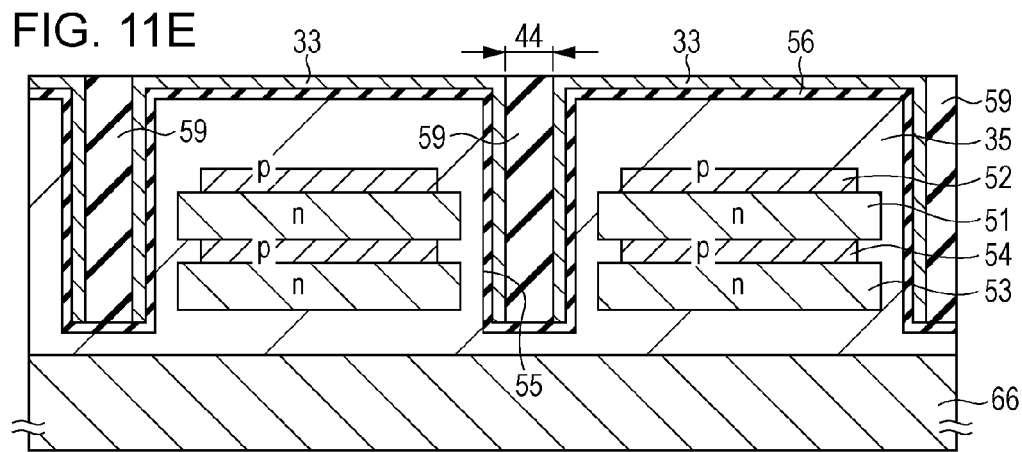

Next, as shown in FIG. 11E, the substrate front face is smoothed by chemical mechanical polishing (CMP) so that the insulating film 59 and the transfer gate electrode 33 are on the same plane.

Figure 11F:
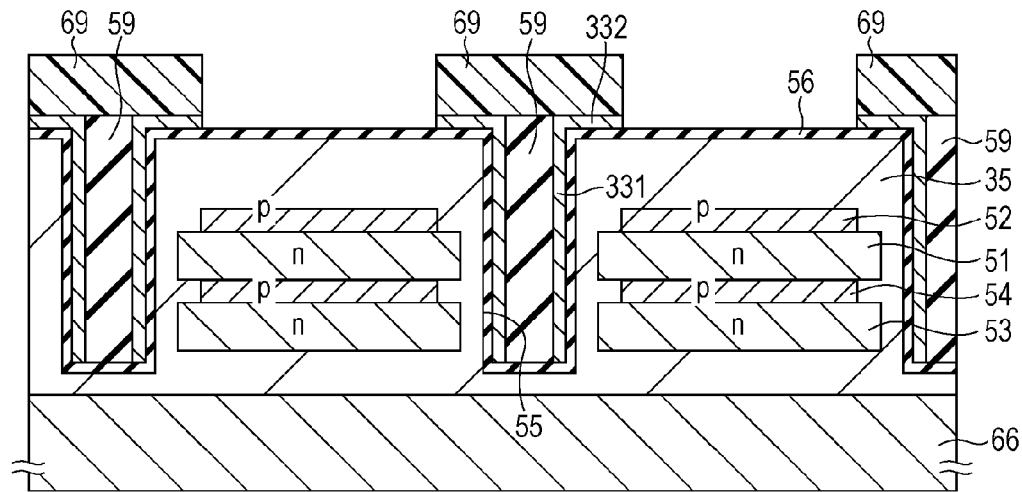

Next, as shown in FIG. 11F, a resist mask 69 having a width wider than the width of the groove 55 is selectively formed on the front face corresponding to the groove 55. Next, the transfer gate electrode 33 on the substrate front face is selectively removed by dry etching via the resist mask 69. Thus, the vertical transfer gate electrode 331 that surrounds the photodiodes PD (PDa, PDb) is formed on the inner wall face of the groove 55, and the horizontal transfer gate electrode 332 is formed on the substrate front face in the periphery of the groove 55.

Figure 12G:
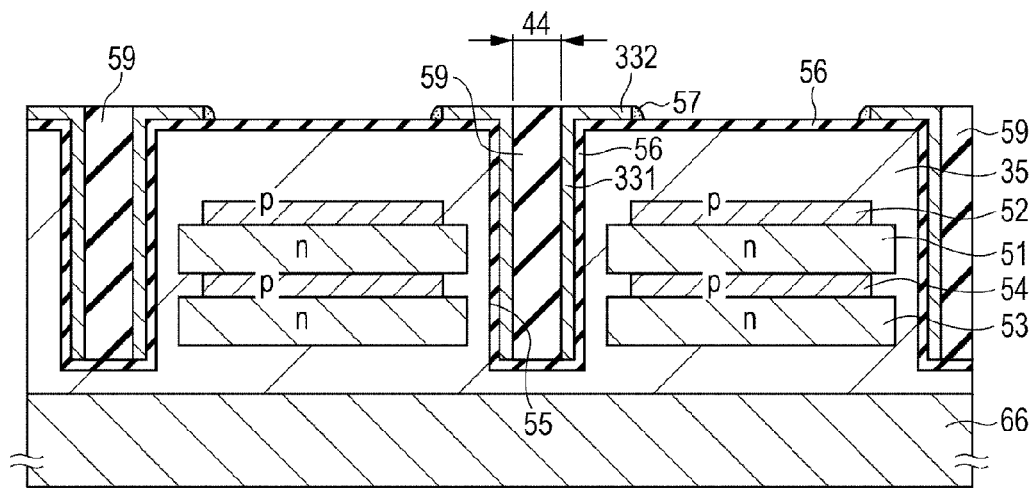
FIGS. 12G through 12H are manufacturing process diagrams (part 3) of a first manufacturing method example of the solid-state imaging device according to the first embodiment.

Next, as shown in FIG. 12G, the resist mast 69 is removed, and a side wall 57 is formed with an insulating film on the side face of the horizontal transfer gate electrode 332. That is to say, a stopper film made of a silicon nitride film and a silicon oxide film form the side wall 57 on the side face of the horizontal transfer gate electrode 332. A device dividing region 44 that divides adjacent unit pixels 21 are formed with an insulating film 59 that fills in the groove 55.

Note that although not shown, a p-type semiconductor well region is formed in the substrate region on the outer side of the photodiodes PD (PDa, PDb) within the unit pixels 21, and at the same time that the transfer gate electrode 33 is formed, the other reset gate electrode, amplifying gate electrode, and selection gate electrode are formed.

Figure 12H:
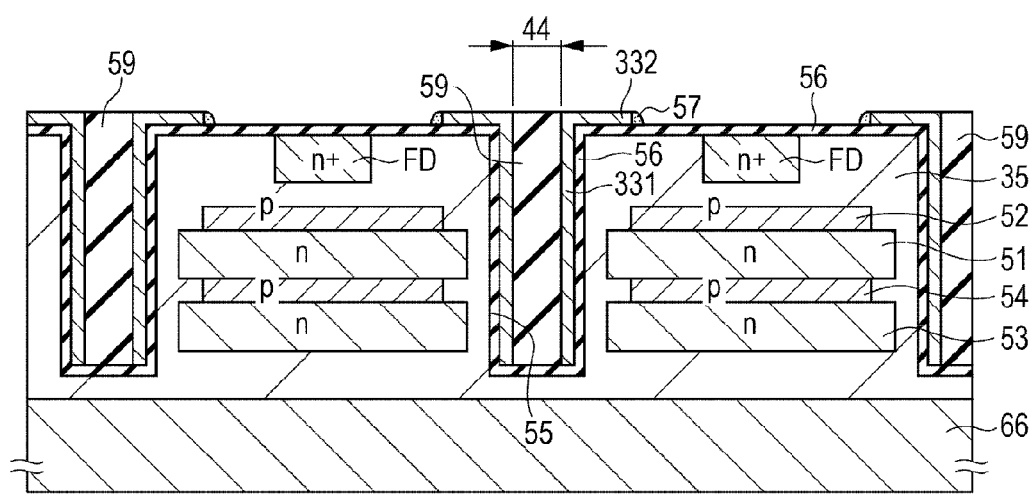

Next, as shown in FIG. 12H, a resist mask is formed on the front face of the n-type semiconductor well region 35 corresponding to on the photodiodes PD (PDa, PDb). Using the resist mask and side wall as a mask, a floating diffusion portion FD is formed on the high dopant concentration n-type semiconductor region by ion implantation. The floating diffusion portion FD is formed in the center of the photodiodes PD (PDa, PDb) region when viewed from above. At the same time, although not shown, source and drain regions for the reset transistor, amplifying transistor, and selection transistor are formed.

Figure 13:
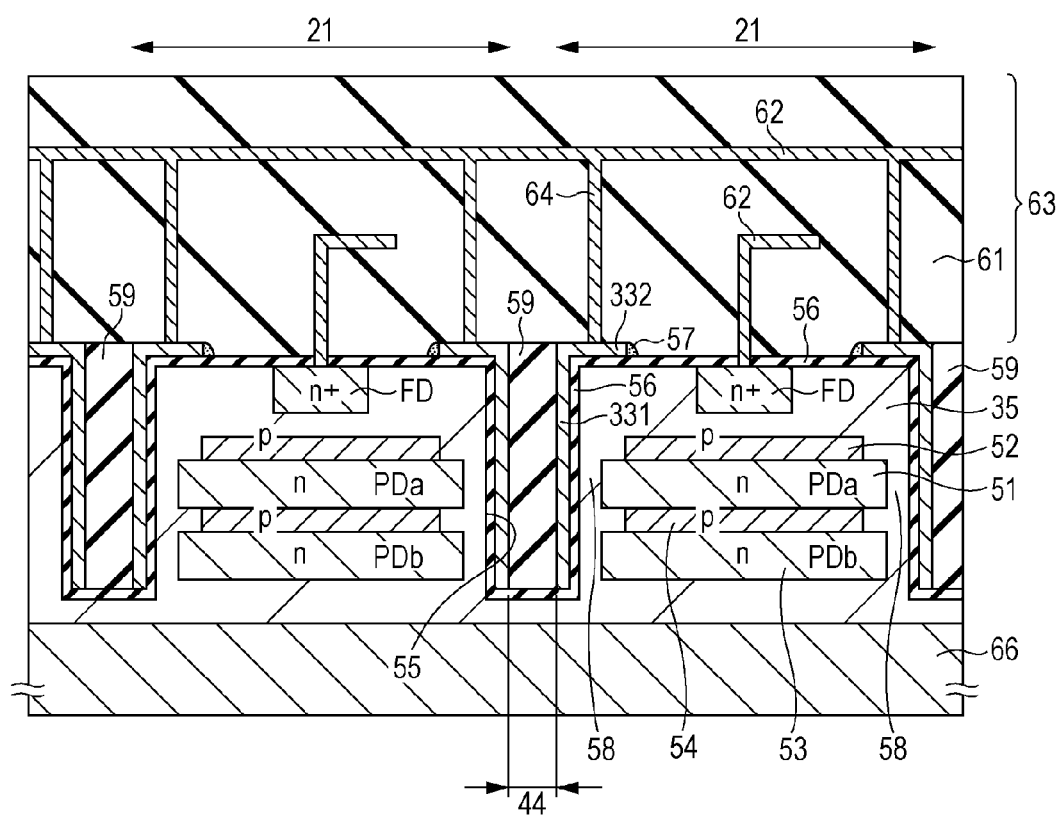
FIG. 13 is a manufacturing process diagram (part 4) of a first manufacturing method example of the solid-state imaging device according to the first embodiment.

Next, as shown in FIG. 13, a wiring layer 63 made up of multiple layers of lines 62 is formed on the substrate front face with an intra-layer insulating film 61 introduced therebetween. A conducting plug 64 connecting between each layer of lines 62 as appropriate and between the lines 62 and pixel transistors as appropriate is also formed.

Next, in the case of a backside illuminated device for example, a supporting substrate is adhered onto the wiring layer 63, and the substrate back face is removed by grinding and polishing down to near the photodiode PD. Subsequently, the p-type semiconductor region for suppressing dark current is formed on the substrate back face, and a color filter and on-chip lens are formed on the substrate back face side via an insulating film such as an anti-reflective film for example, whereby the desired backside illuminated of solid-state imaging device 311 is obtained.

For example, in the case of a frontside illuminated, the wiring layer 63 is formed so that the lines 62 are not formed on the photodiodes PD (PDa, PDb). A color filter and on-chip lens are formed on the wiring layer 63 via a smoothing film, and the desired frontside illuminated of solid-state imaging device 312 is obtained.

Manufacturing Method Example 2 of Solid-State Imaging Device

FIGS. 14A through 17J show a second example of a manufacturing method of the above-mentioned solid-state imaging device 31.

Figure 14A:
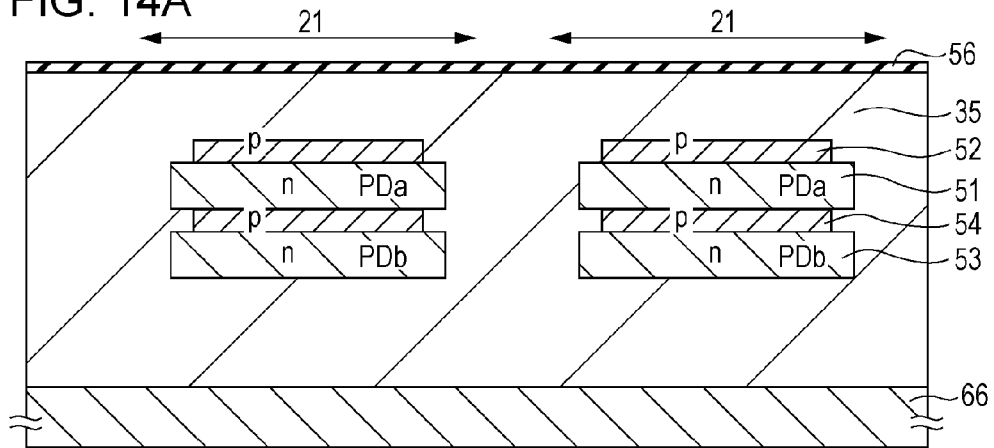
FIGS. 14A through 14C are manufacturing process diagrams (part 1) of a second manufacturing method example of the solid-state imaging device according to the first embodiment.
Figure 14B:
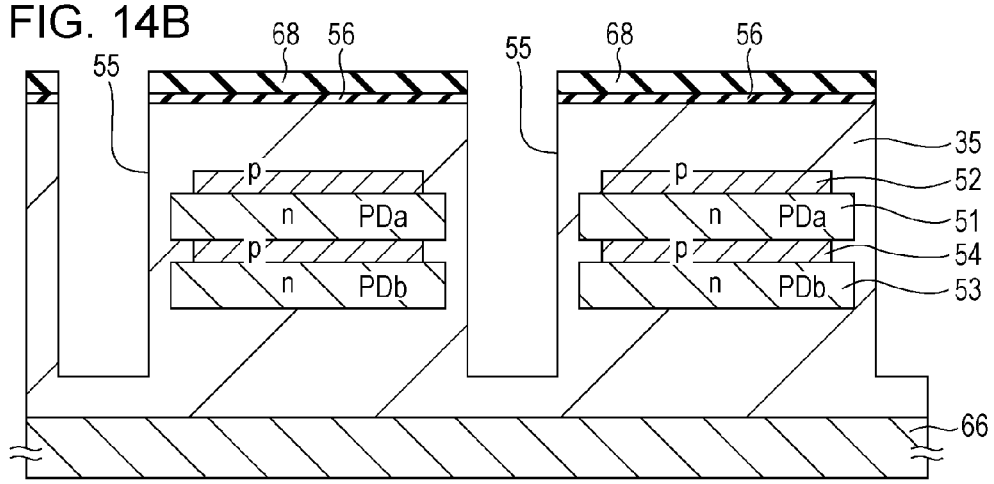
Figure 14C:
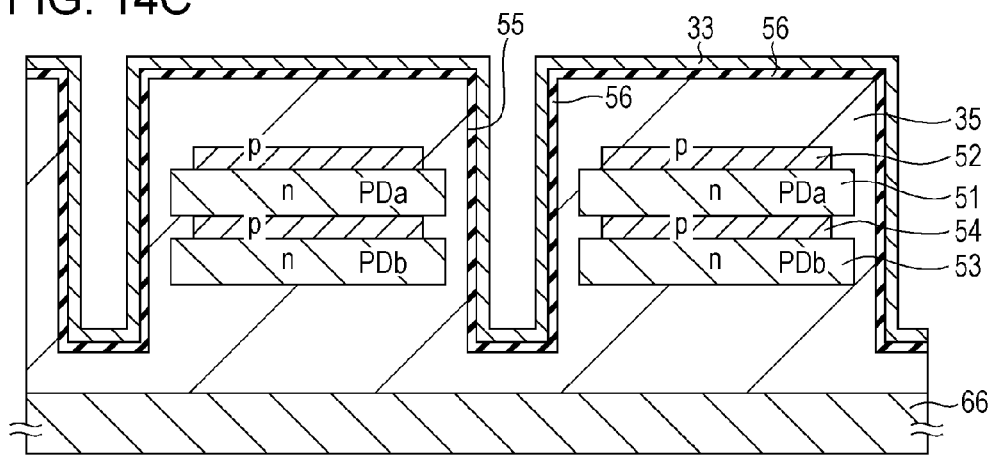

The processes in FIGS. 14A through 14C are roughly the same as the processes in the above-described FIGS. 10A through 10C. That is to say, as shown in FIG. 14A, an n-type semiconductor well region 35 having a relatively low dopant concentration is formed on a silicon semiconductor substrate 66. A first and second photodiode PDa and PDb that are embedded in the n-type semiconductor well region 35 and accumulated in the substrate depth direction are formed. The first photodiode PDa has an n-type semiconductor region 51 and p-type semiconductor region 52 serving as charge accumulating regions. The second photodiode PDb has an n-type semiconductor region 53 and p-type semiconductor region 54 serving as charge accumulating regions. The photodiodes PD (PDa, PDb) are each formed on a region corresponding to the unit pixels 21. The photodiode PD is formed by ion implantation via a mask such as a resist mask or the like. A gate insulating film (silicon oxide film) 56 is formed on the front face of the semiconductor substrate 66 by thermal oxidation.

Next, as shown in FIG. 14B, a hard mask 68 made of an insulating film having a different etching rate from the gate insulating film 56 and the silicon substrate 66 thereunder is formed on the gate insulating film 56. Dry etching is performed via the hard mask 68, and a groove 55 that reaches a depth position beyond that of the second photodiode PDb from the substrate front face is formed so as to divide the unit pixels 21. The depth of the groove 55 is greater than the depth of the groove 55 in the above-described FIG. 10B. The groove 55 is formed so as to surround the entire periphery of the first and second photodiodes PDa and PDb.

Next, as shown in FIG. 14C, a gate insulating film 56 is formed on the entire inner wall face of the groove 55 by thermal oxidation. Next, after the hard mask 68 is removed, a transfer gate electrode 33 of the transfer transistor Tr1 is formed on the gate insulating film 56 on the groove inner wall face (entire inner wall) and substrate front face. The transfer gate electrode 33 can be made of a polysilicon film, copper film, or aluminum film doped by a dopant, for example.

Figure 15D:
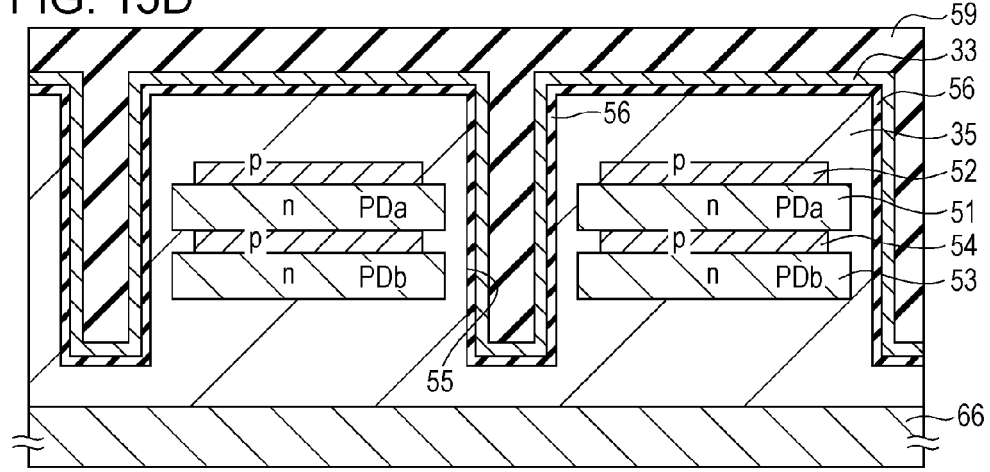
FIGS. 15D through 15F are manufacturing process diagrams (part 2) of a second manufacturing method example of the solid-state imaging device according to the first embodiment.

Next, as shown in FIG. 15D, the insulating film 59 made of a silicon oxide film for example is formed on the substrate front face so as to fill in the groove 55. The insulating film 59 herein can be formed by chemical vapor deposition (CVD), for example.

Figure 15E:
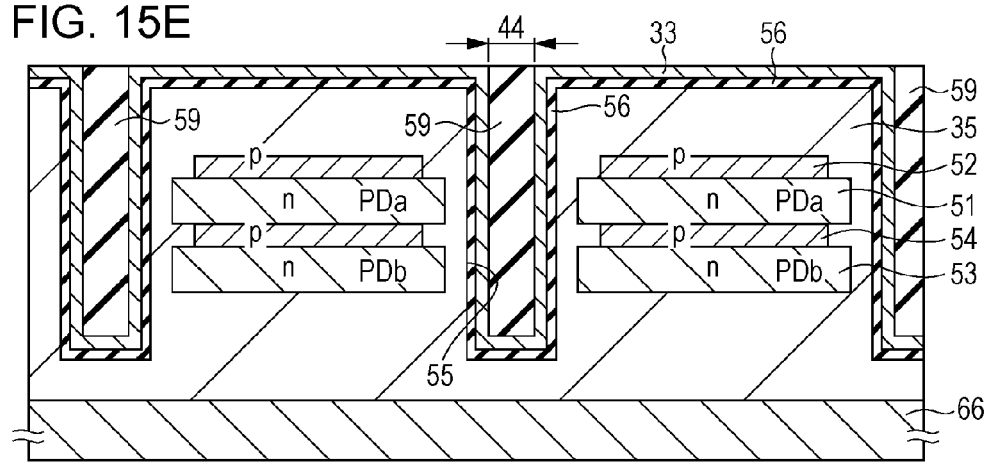

Next, as shown in FIG. 15E, the substrate front face is smoothed by chemical mechanical polishing (CMP) so that the insulating film 59 and the transfer gate electrode 33 are on the same plane.

Figure 15F:
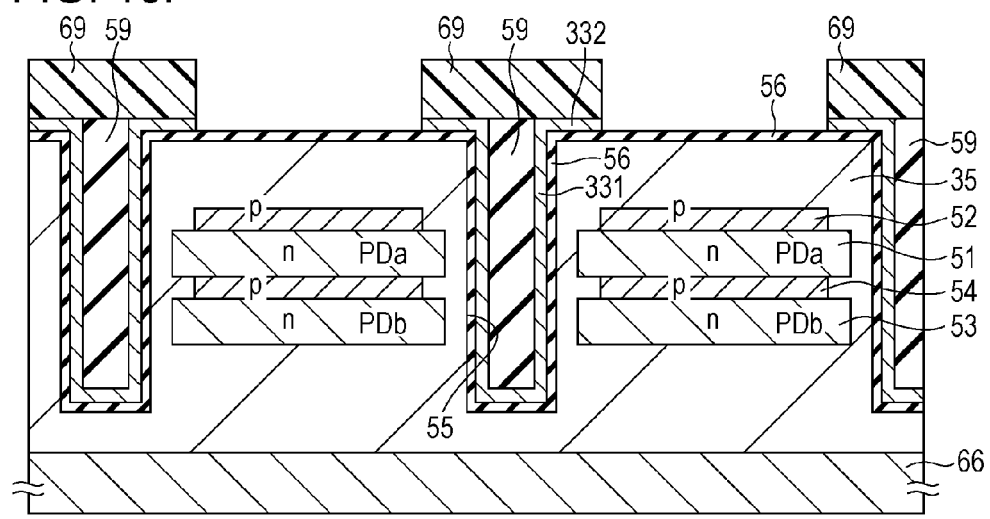

Next, as shown in FIG. 15F, a resist mask 69 having a width wider than the width of the groove 55 is selectively formed on the front face corresponding to the groove 55. Next, the transfer gate electrode 33 on the substrate front face is selectively removed by dry etching via the resist mask 69. Thus, the vertical transfer gate electrode 331 that surrounds the photodiodes PD (PDa, PDb) is formed on the inner wall face of the groove 55, and the horizontal transfer gate electrode 332 is formed on the substrate front face in the periphery of the groove 55.

Figure 16G:
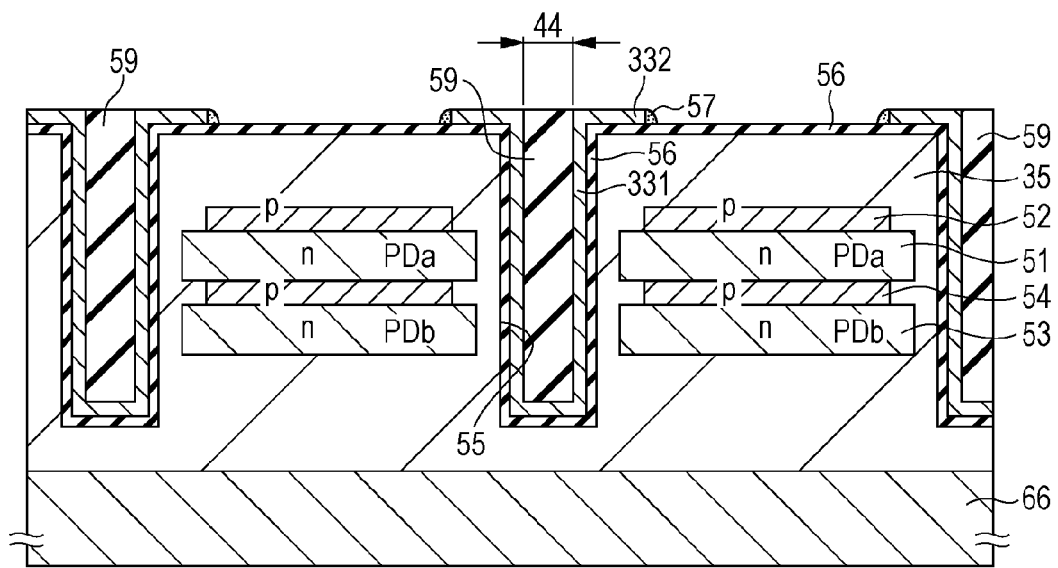
FIGS. 16G through 16H are manufacturing process diagrams (part 3) of a second manufacturing method example of the solid-state imaging device according to the first embodiment.

Next, as shown in FIG. 16G, the resist mast 69 is removed, and a side wall 57 is formed with an insulating film on the side face of the horizontal transfer gate electrode 332. That is to say, a stopper film made of a silicon nitride film and a silicon oxide film form the side wall 57 on the side face of the horizontal transfer gate electrode 332. A device dividing region 44 that divides adjacent unit pixels 21 are formed with an insulating film 59 that fills in the groove 55.

Note that although not shown, a p-type semiconductor well region is formed in the substrate region on the outer side of the photodiodes PD (PDa, PDb) within the unit pixels 21, and at the same time that the transfer gate electrode 33 is formed, the other reset gate electrode, amplifying gate electrode, and selection gate electrode are formed.

Figure 16H:
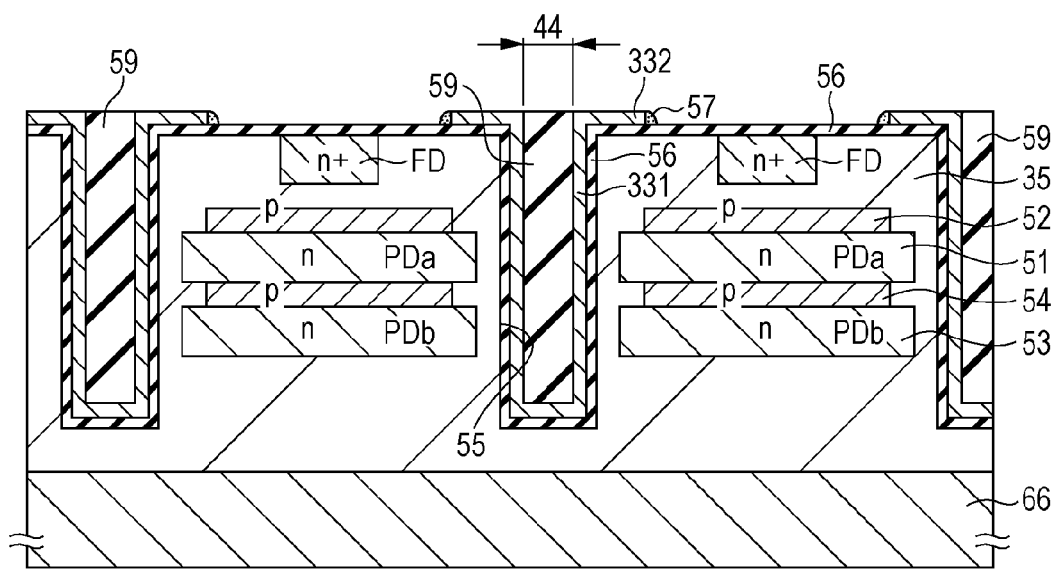

Next, as shown in FIG. 16H, a resist mask is formed on the front face of the n-type semiconductor well region 35 corresponding to on the photodiodes PD (PDa, PDb). Using the resist mask and side wall as a mask, a floating diffusion portion FD is formed on the high dopant concentration n-type semiconductor region with ion implantation. The floating diffusion portion FD is formed in the center of the photodiodes PD (PDa, PDb) region when viewed from above. At the same time, although not shown, source and drain regions for the reset transistor, amplifying transistor, and selection transistor are formed.

Next, as shown in FIG. 16I, a wiring layer 63 made up of multiple layers of lines 62 is formed on the front face of the semiconductor substrate 66 via an intra-layer insulating film 61. Subsequently, although not shown, a supporting substrate is adhered onto the wiring layer 63.

Figure 17I:
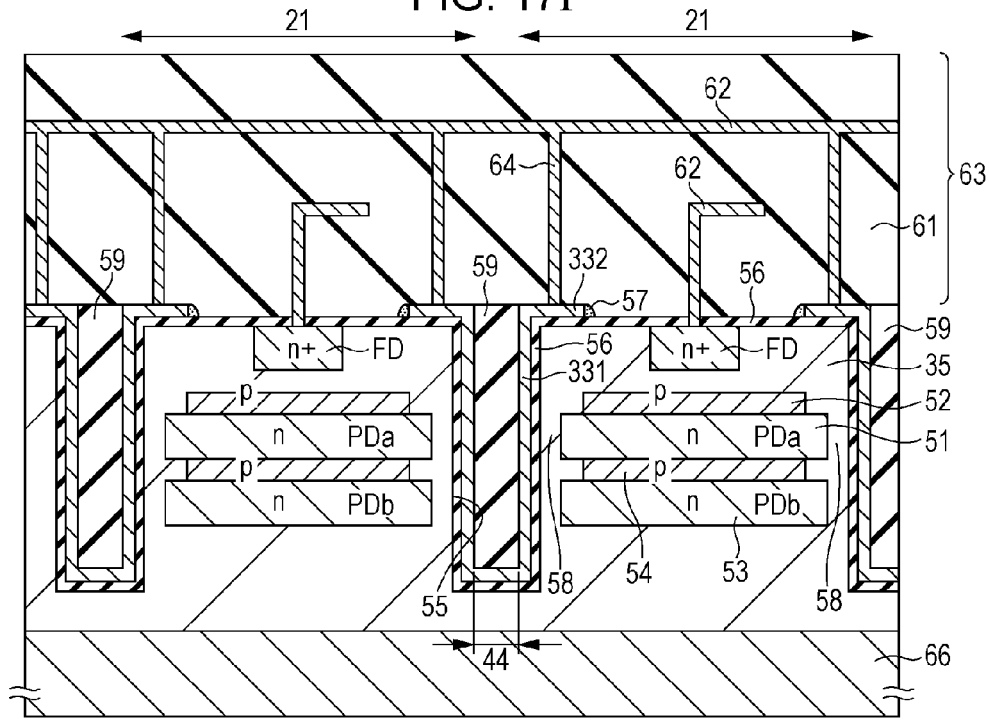
FIGS. 17I through 17J are manufacturing process diagrams (part 4) of a second manufacturing method example of the solid-state imaging device according to the first embodiment.
Figure 17J:
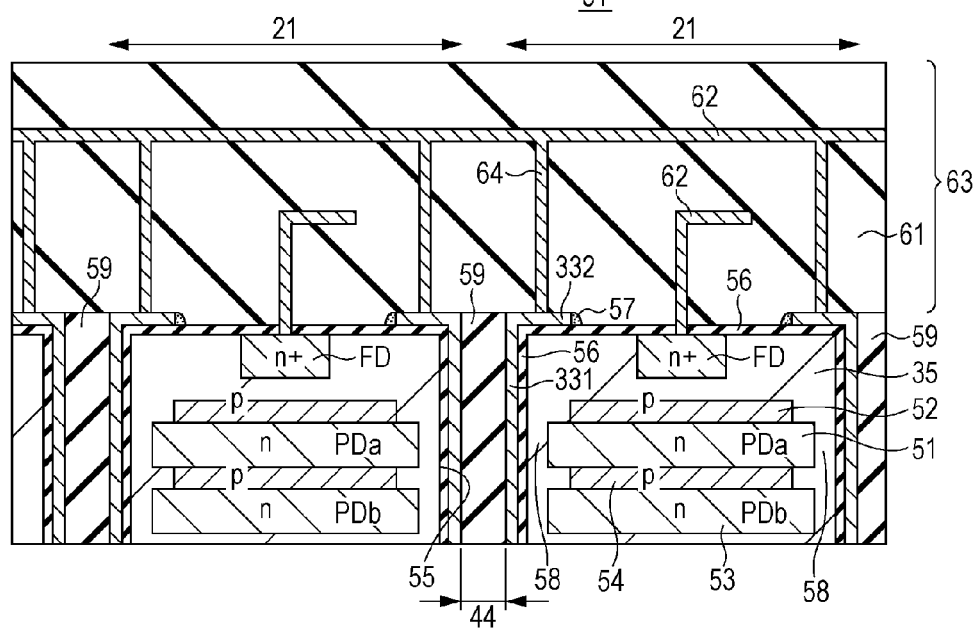

Next, as shown in FIG. 17J, the substrate back face is removed up to the depth that the bottom portion of the vertical transfer gate electrode 331 within the groove 55 is removed, using chemical mechanical polishing (CMP) and wet etching, for example, from the back face side of the semiconductor substrate 66. With the removal process of the substrate back face, the vertical transfer gate electrode 331 within the groove 55 is divided so as to surround the photodiodes PD (PDa, PDb) of each unit pixel 21.

The manufacturing method example 2 herein is applicable to a backside illuminated of solid-state imaging device. Accordingly, subsequently, although not shown in the diagrams, the p-type semiconductor region for suppressing dark current is formed on the substrate back face, and a color filter and on-chip lens are formed on the substrate back face side via an insulating film such as an anti-reflective film for example, whereby the desired backside illuminated of solid-state imaging device 311 is obtained.

According to the above-described manufacturing method example 1 and manufacturing method example 2 of the solid-state imaging device, and even if the pixel size is reduced, microfabrication of the vertical transfer gate electrodes becomes easier. Thus, saturation charge amount can be increased, charge transfer efficiency improved, and a solid-state imaging device of a backside illuminated or frontside illuminated with suppressed dark current can be manufactured readily and precisely.

3. Second Embodiment

Configuration Example of Solid-State Imaging Device

Figure 18:
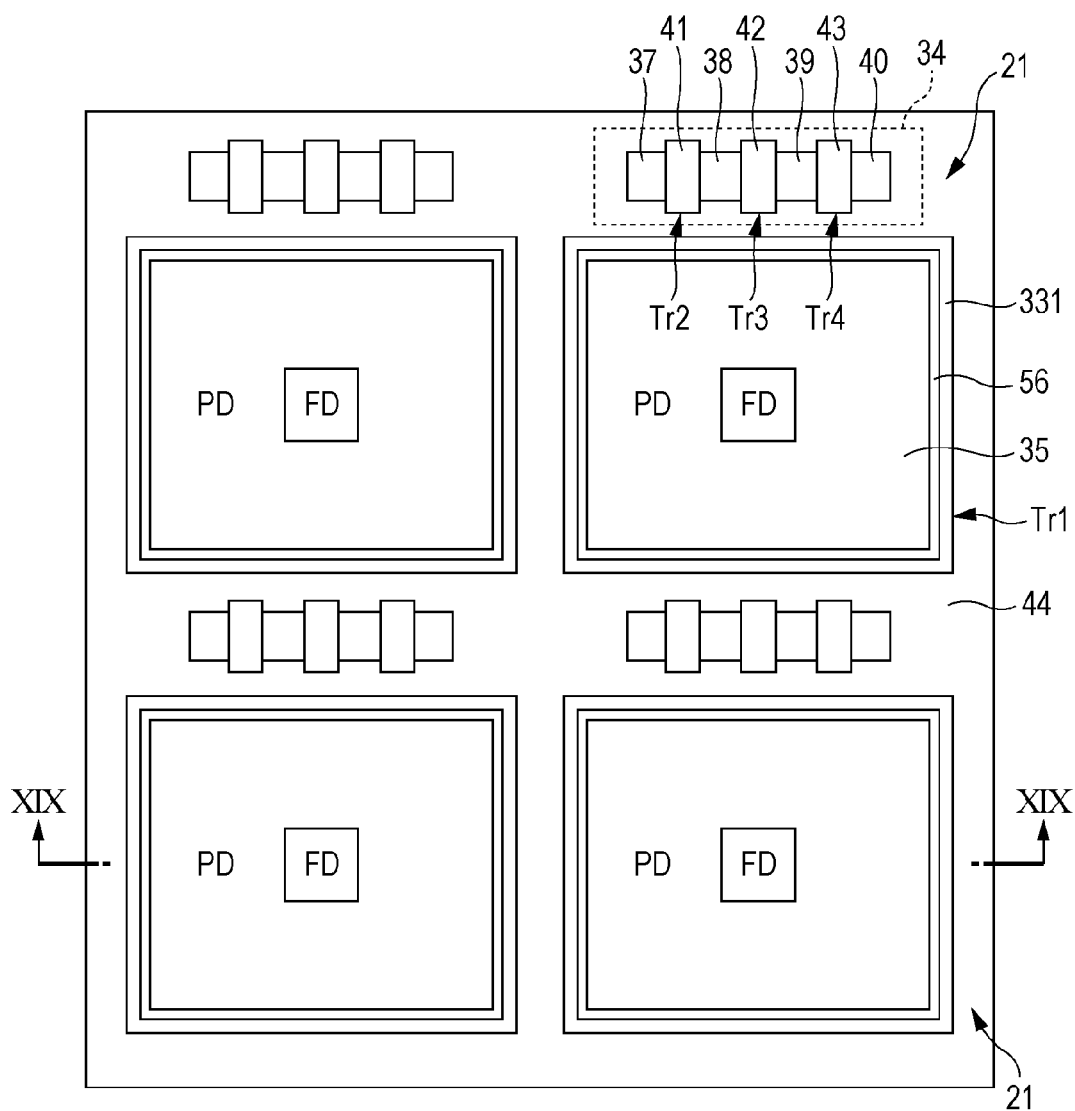
FIG. 18 is a schematic plan view illustrating a second embodiment of the solid-state imaging device according to the present invention.
Figure 19:
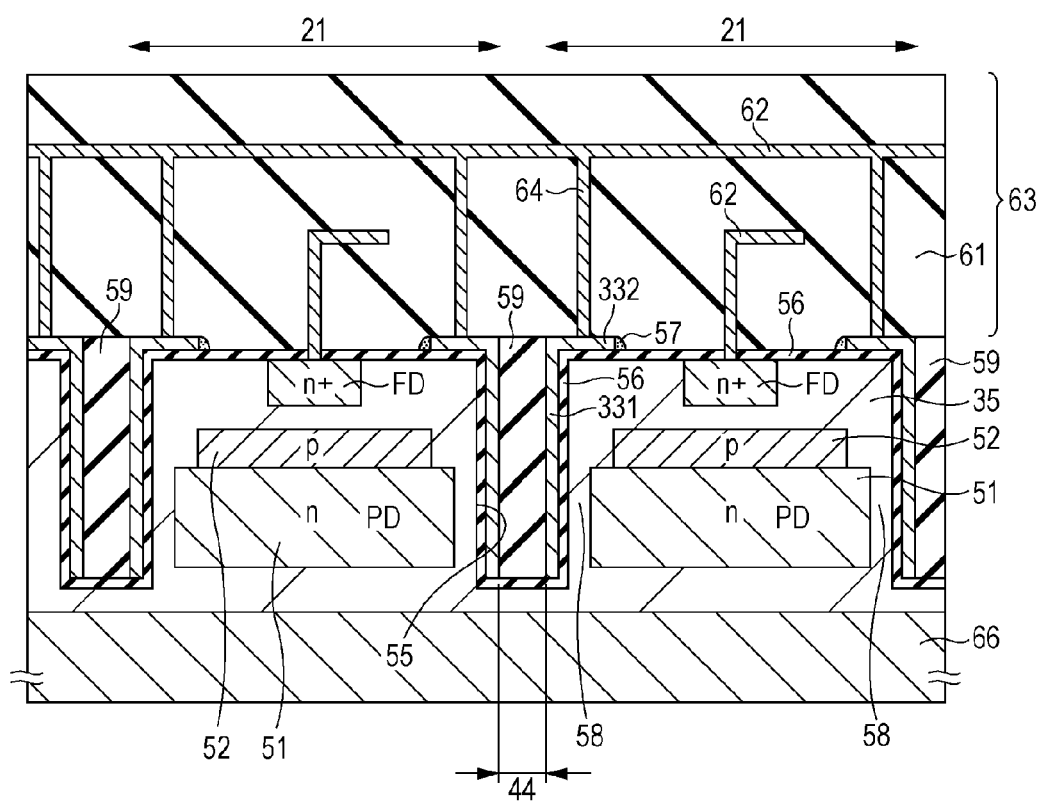
FIG. 19 is a schematic cross-sectional view along line XIX-XIX in FIG. 18.

FIGS. 18 and 19 show a second embodiment of the solid-state imaging device relating to the present invention. The present embodiment is of a case of being applied to a CMOS solid-state imaging device wherein unit pixels 21 are arrayed. FIG. 18 is a schematic plan view of the primary portions of the pixel region 3, and FIG. 19 is a schematic cross-sectional view along line XIX-XIX in FIG. 18.

A solid-state imaging device 91 relating to the second embodiment has multiple unit pixels 21 made up of photodiodes PD serving as photoelectric converters and pixel transistors arrayed on the pixel region 3, as shown in FIG. 18. With each unit pixel 21, a floating diffusion portion FD is formed so as to exist within the region making up the photodiodes PD viewed from above, and vertical transfer gate electrodes 33 of the transfer transistor Tr1 surround the entire periphery of each photodiode PD. Reference numeral 34 denotes the pixel transistor region. According to the present example, the floating diffusion portion FD is formed in the center of the region corresponding to the photodiode PD. As shown in FIG. 19, one photodiode PD is formed in a predetermined depth within the semiconductor substrate 35.

A reset transistor Tr2, amplifying transistor Tr3, and selection transistor Tr4 are formed on the pixel transistor region 34 of each unit pixel 21.

A device dividing region 44 for device division of the various unit pixels 21 is formed between adjacent unit pixels 21. The device dividing region 44 can be made up of an insulated device dividing region formed by imbedding an insulating film into a groove, for example. Alternatively, the device dividing region 44 can be made up of a dopant dispersion region.

The cross-sectional configuration of the unit pixel 21 will be described with reference to the cross-sectional diagram in FIG. 19. As a semiconductor substrate 35, for example a second conducting type, e.g. a p-type semiconductor substrate can be used. The semiconductor substrate 35 can also be replaced by a semiconductor well region. According to the present example, the photodiode PD of the unit pixel 21 is formed in a predetermined depth position within the p-type semiconductor substrate 35. The photodiode PD is made up by forming a p-n junction with an n-type semiconductor region 51 serving as a charge accumulating region and a p-type semiconductor region 52 thereabove.

On the other hand, a groove 55 reaching a depth position of the photodiode PD from the substrate front face is formed on the semiconductor substrate 35 so as to surround the photodiode PD of each unit pixel 21. A gate insulating film 56 of a silicon oxide film or the like, for example, is formed from the inner face of the groove 55, over the substrate front face, and further, a transfer gate electrode 33 is formed on the gate insulating film 56 of the inner wall face of the groove 55. The transfer gate electrode 33 is divided for each unit pixel 21 and formed so as to surround the photodiode PD. The transfer gate electrode 33 is formed so as to extend from the groove inner wall face to a portion of the semiconductor substrate front face.

The vertical transfer gate electrode 331 is made up of the gate electrode 33 formed on the inner wall face of the groove 55. Also, a horizontal transfer gate electrode 332 is made up of the gate electrode 33 continuing from the vertical transfer gate electrode 331 and extending along the substrate front face side.

A floating diffusion portion FD made up of an n-type semiconductor region is formed on the front face of the semiconductor substrate 35 corresponding to the regions of the photodiode PD of each unit pixel 21. The floating diffusion portion FD is formed in the center of the region making up the photodiode PD, when viewed from above.

The center portion of the groove 55, wherein the vertical transfer gate electrode 331 is formed on the inner wall face, has an insulating layer 59 for example filled in to form a device dividing region 44. The reset transistor Tr2, amplifying transistor Tr3, and selection transistor Tr4 are formed on a p-type semiconductor well region that is formed on the front face side of the semiconductor substrate 36 although not shown. On the front face of the semiconductor substrate 35, a wiring layer 63 in which multiple layers of lines 62 are arrayed is formed with the intra-layer insulating film 61 introduced therebetween. Appropriate lines 62 are connected to appropriate portions of the unit pixels 21 via a semiconductor plug 64.

The configuration of the other portions are similar to those described according to the above-described first embodiment, so portions corresponding to FIGS. 4 and 5 are denoted with the same reference numerals, and redundant description will be omitted.

According to the solid-state imaging device 91 relating to the second embodiment, similar to the first embodiment, the vertical transfer gate electrode 331 is formed so as to surround the photodiode PD, and the floating diffusion portion FD is disposed within the region corresponding to the photodiode PD. Accordingly, even if the pixel size is reduced, the saturation charge amount can be increased. The charge is transferred from the periphery of the floating diffusion portion FD to the floating diffusion portion FD, whereby the transfer path of the charge becomes the shortest distance, and charge transfer efficiency can be improved. By applying negative bias voltage to the transfer gate electrode 33 (331, 332) at the time of charge accumulation, dark current can be suppressed.

4. Third Embodiment

Configuration Example of Solid-State Imaging Device

Figure 20:
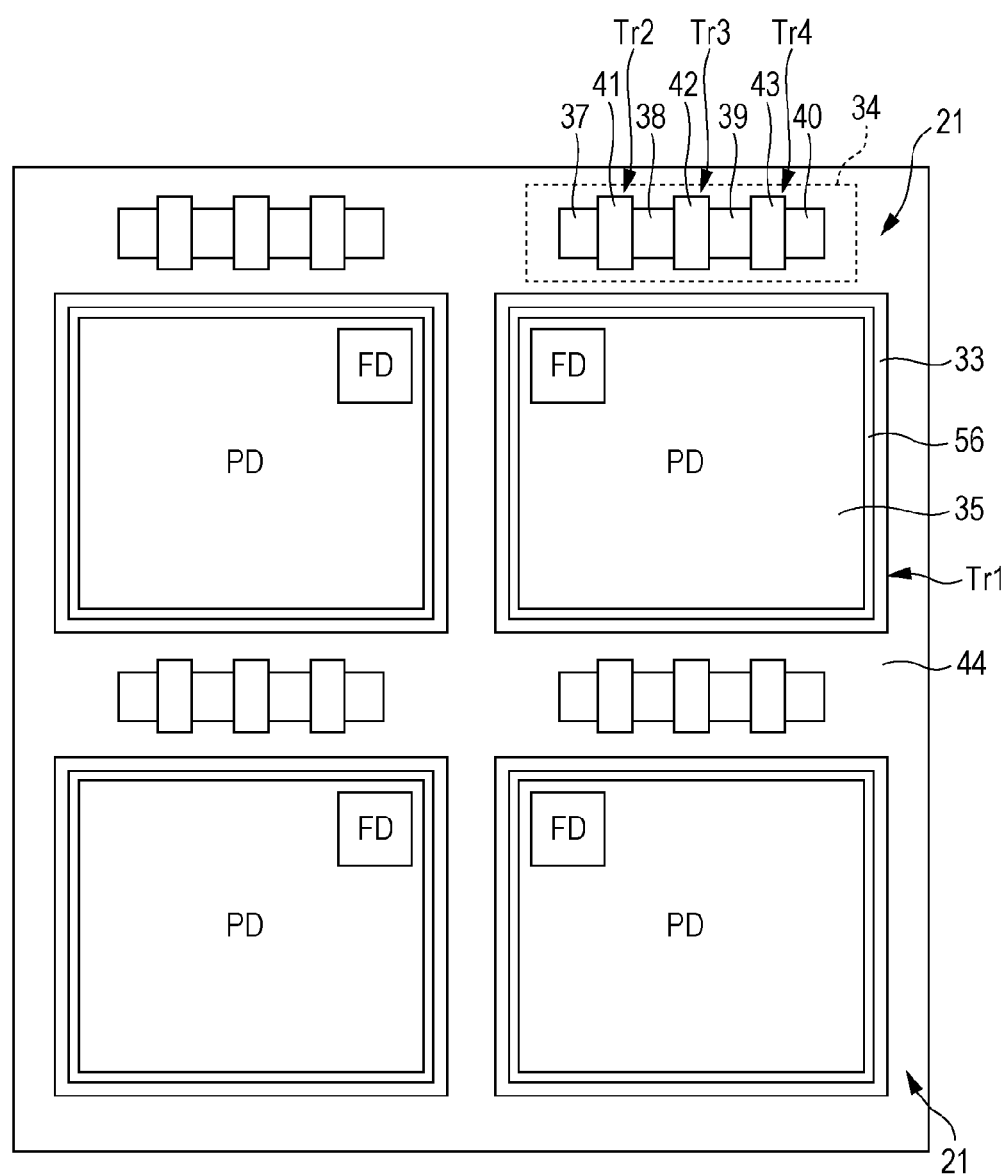
FIG. 20 is a schematic plan view of the primary portions illustrating a third embodiment of the solid-state imaging device according to the present invention.

FIG. 20 shows a third embodiment of the solid-state imaging device relating to the present invention. The present embodiment is of a case of being applied to a CMOS solid-state imaging device wherein unit pixels 21 are arrayed. FIG. 20 is a schematic plan view of the primary portions of the pixel region 3.

The position of the floating diffusion portion FD is not limited to the center of the region corresponding to the photodiode PD, and can be disposed at any position within the region corresponding to the photodiode. Even if the position of the floating diffusion portion FD is other than the center, charge transfer to the floating diffusion portion FD can be made by potential design.

The solid-state imaging device 93 relating to the third embodiment is configured by disposing the floating diffusion portion FD in one corner of the region corresponding to the photodiode PD. According to the present embodiment, when four unit pixels 21 in a two-vertical×two-horizontal configuration are one set, each floating diffusion portion FD is disposed so as to be collected in the center of one set. Similar to the first and second embodiment, multiple photodiodes PD may be layered, or one may be disposed, within the substrate. Other configurations including the vertical transfer gate electrode 331 are similar to that described with the first and second embodiments, so corresponding portions are denoted with the same reference numerals, and redundant description will be omitted.

According to the solid-state imaging device 93 relating to the third embodiment, the floating diffusion portion FD is disposed within the region corresponding to the photodiode PD, and the vertical transfer gate electrode 331 is formed so as to surround the photodiode PD. Accordingly, similar to that described above, the saturation charge amount can be increased, even if the pixel size is reduced. Transfer efficiency of charge to the floating diffusion portion FD can be improved. By applying negative bias voltage to the vertical transfer gate electrode 331, dark current can be suppressed at the time of charge accumulation.

5. Fourth Embodiment

Configuration Example of Solid-State Imaging Device

Figure 21:
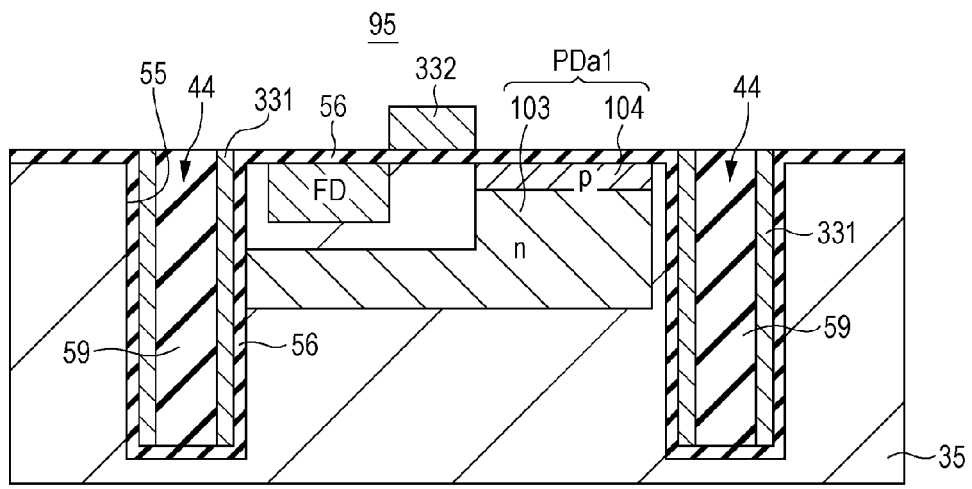
FIG. 21 is a schematic cross-sectional view of the primary portions illustrating a fourth embodiment of the solid-state imaging device according to the present invention.

FIG. 21 shows a fourth embodiment of the solid-state imaging device relating to the present invention. The present embodiment is of a case of being applied to a CMOS solid-state imaging device wherein unit pixels are arrayed. A solid-state imaging device 95 relating to the fourth embodiment has a floating diffusion portion FD on the front face of the semiconductor substrate 35 of each unit pixel and a front face photodiode PDa1. The front face photodiode PDa1 is formed with a p-type semiconductor region 104 that is separated from the floating diffusion portion FD and an n-type semiconductor region 103 serving as a charge accumulation region extending below a portion of the floating diffusion portion FD, on the substrate front face. The floating diffusion portion FD exists within a region corresponding to the photodiode PDa1, when seen from above.

According to the present embodiment, a horizontal transfer gate electrode 332 is formed on substrate front face between the floating diffusion portion FD and the photodiode PD, via the gate insulating film 56. Further, a vertical transfer gate electrode 331 is formed so as to surround the front face photodiode PDa1, via the transfer gate insulating film 56. The floating diffusion portion FD is formed at a position near the vertical transfer gate electrode 331. The vertical transfer gate electrode 331 and horizontal transfer gate electrode 332 that are formed so as to be mutually separated are electrically connected though not shown in the diagram. A device dividing region 44 is formed between adjacent unit pixels 21. The device dividing region 44 is formed so as to fill in the groove 55 wherein the vertical transfer gate electrode 331 is formed.

Other configurations including the pixel transistors, wiring layer, and so forth are similar to that described with the first embodiment, so corresponding portions are denoted with the same reference numerals, and redundant description will be omitted.

According to the solid-state imaging device 95 relating to the fourth embodiment, a transfer pulse φTG is applied simultaneously to the vertical transfer gate electrode 331 and horizontal transfer gate electrode 332 at the time of charge readout, and the transfer transistor is turned on. By the transfer transistor having been turned on, the charge accumulated in the n-type semiconductor region 103, which is a charge accumulating region, is transferred to the floating diffusion portion FD through the channel region below the vertical transfer gate electrode 331 and the channel region below the horizontal transfer gate electrode 332. When accumulating charge, negative bias voltage is applied to both transfer gate electrodes 331 and 332, and hole pinning Occurs.

According to the solid-state imaging device 95 relating to the fourth embodiment, even if the pixel size is reduced a wide area can be realized for the photodiode PD, whereby saturation charge amount can be increased. Also, transfer efficiency of charge to the floating diffusion portion FD can be improved. Dark current is also suppressed.

First Modification of Fourth Embodiment

Figure 22:
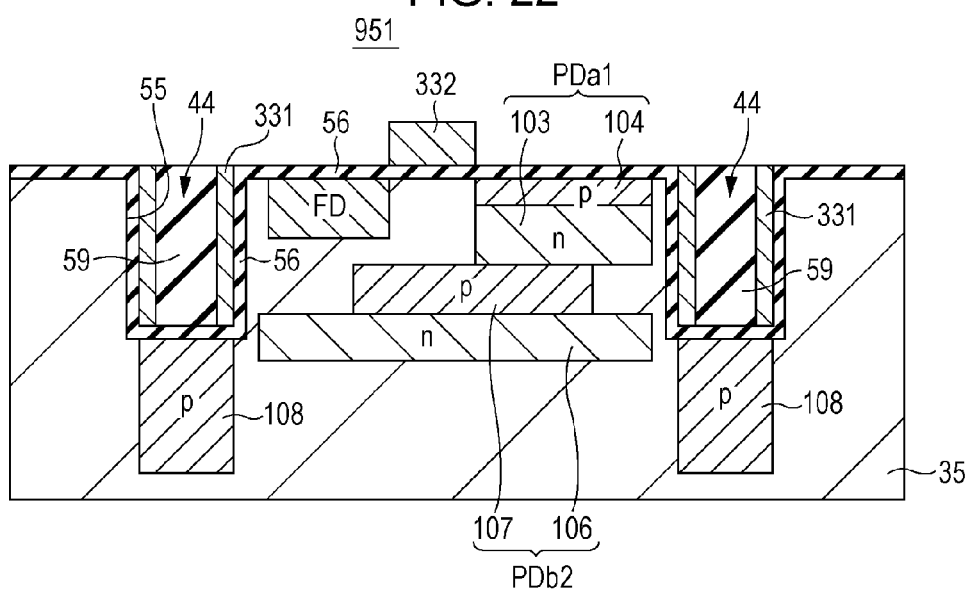
FIG. 22 is a schematic cross-sectional view of the primary portions illustrating a first modification of the fourth embodiment of the solid-state imaging device according to the present invention.

FIG. 22 shows a solid-state imaging device relating to a first modification of the fourth embodiment. A solid-state imaging device 951 relating to the first modification is formed with a floating diffusion portion FD and front face photodiode PDa1 on the front face of the semiconductor substrate 35 for each unit pixel, and an embedded photodiode PDb2 is formed under the front face photodiode PDa1. The front face photodiode PDa1 is formed with an n-type semiconductor region 103 and p-type semiconductor region 104. The embedded photodiode PDb2 is formed by an n-type semiconductor region 106 and p-type semiconductor region 107 adjacent to the n-type semiconductor region 103 of the front face photodiode PDa1. The n-type semiconductor region 106 is formed so as to extend towards the vertical transfer gate electrode 331. A p-type semiconductor well region 108 that serves as a device dividing region is formed below the region including the vertical transfer gate electrode 331 and device dividing region 44. The floating diffusion portion FD exists within a region corresponding to the photodiode PDb2 as seen from above. Other configurations are similar to that described with reference to FIG. 21, so portions in FIG. 22 which correspond to portions in FIG. 21 are denoted with the same reference numerals, and redundant description will be omitted.

With the solid-state imaging device 951, a transfer pulse φTG is applied simultaneously to the vertical transfer gate electrode 331 and horizontal transfer gate electrode 332 at the time of charge readout, and the transfer transistor is turned on. By the transfer transistor having been turned on, the charge accumulated in the n-type semiconductor region 103, which is a charge accumulating region of the front face photodiode PDa1, is primarily transferred to the floating diffusion portion FD through the channel region below the horizontal transfer gate electrode 332. The charge accumulated in the n-type semiconductor region 106, which is a charge accumulating region of the embedded photodiode PDb2, is transferred to the floating diffusion portion FD through the channel region below the vertical transfer gate electrode 331. When accumulating charge, negative bias voltage is applied to both transfer gate electrodes 331 and 332, and hole pinning occurs.

According to the solid-state imaging device 951, similar to the above-described, even if the pixel size is reduced, a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

Second Modification of Fourth Embodiment

Figure 23:
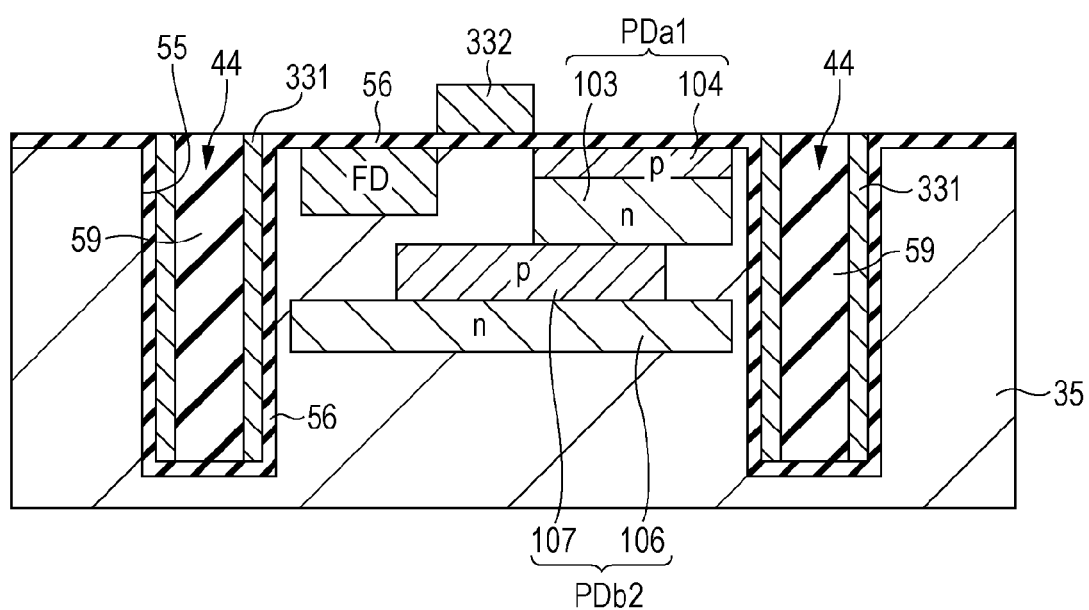
FIG. 23 is a schematic cross-sectional view of the primary portions illustrating a second modification of the fourth embodiment of the solid-state imaging device according to the present invention.

FIG. 23 shows a solid-state imaging device relating to a second modification of the fourth embodiment. The difference between the first modification and the second modification is in the point that the vertical transfer gate electrode 331 is formed to the depth of the embedded-type photodiode PDb2. That is to say, a solid-state imaging device 952 relating to the second modification is formed with a floating diffusion portion FD and front face photodiode PDa1 on the front face of the semiconductor substrate 35 for each unit pixel, and an embedded photodiode PDb2 is formed under the front face photodiode PDa1. The front face photodiode PDa1 is formed with an n-type semiconductor region 103 and p-type semiconductor region 104. The embedded photodiode PDb2 is formed by an n-type semiconductor region 106 and p-type semiconductor region 107 adjacent to the n-type semiconductor region 103 of the front face photodiode PDa1. The n-type semiconductor region 106 is formed so as to extend towards the vertical transfer gate electrode 331. The vertical transfer gate electrode 331 is formed to a depth that exceeds that of the embedded photodiode PD2. The floating diffusion portion FD exists within a region corresponding to the photodiode PDb2 as seen from above. Other configurations are similar to that described with reference to FIG. 22, so portions in FIG. 23 which correspond to portions in FIG. 22 will be denoted with the same reference numerals, and redundant description will be omitted.

With the solid-state imaging device 952, a transfer pulse φTG is applied simultaneously to the vertical transfer gate electrode 331 and horizontal transfer gate electrode 332 at the time of charge readout, and the transfer transistor is turned on. By the transfer transistor having been turned on, the charge accumulated in the n-type semiconductor region 103, which is a charge accumulating region of the front face photodiode PDa1, is primarily transferred to the floating diffusion portion FD through the channel region below the horizontal transfer gate electrode 332. The charge accumulated in the n-type semiconductor region 106, which is a charge accumulating region of the embedded photodiode PDb2, is transferred to the floating diffusion portion FD through the channel region below the vertical transfer gate electrode 331. When accumulating charge, negative bias voltage is applied to both transfer gate electrodes 331 and 332, and hole pinning occurs.

According to the solid-state imaging device 952, similar to the above-described, even if the pixel size is reduced a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

6. Fifth Embodiment

Configuration Example of Solid-State Imaging Device

Figure 24:
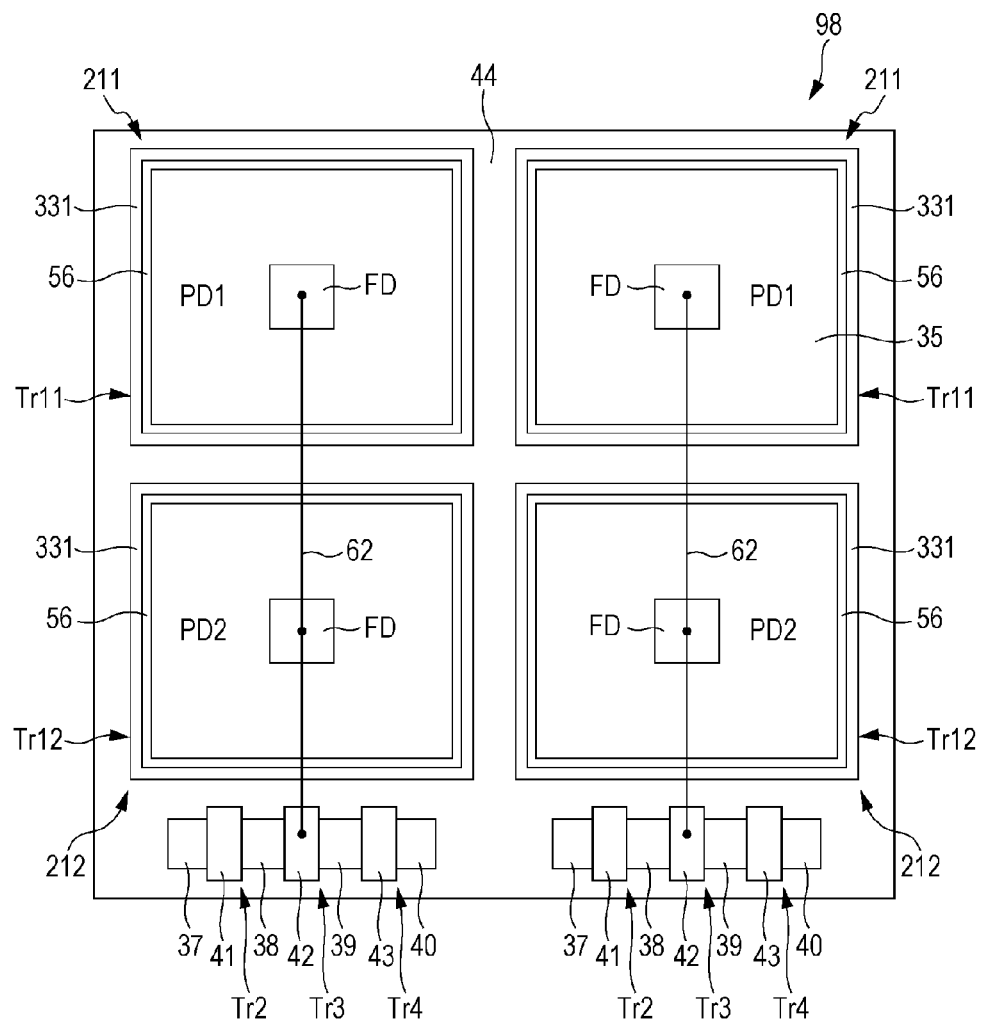
FIG. 24 is a schematic plan view of the primary portions illustrating a fifth embodiment of the solid-state imaging device according to the present invention.

FIG. 24 shows a fifth embodiment of the solid-state imaging device relating to the present invention. The present embodiment is of a case of being applied to a pixel-sharing CMOS solid-state imaging device. FIG. 24 is a schematic plan view of the primary portions of the pixel region 3.

A solid-state imaging device 97 is made by one pixel transistor unit shared between two photodiodes PD (PD1, PD2), which is a unit pixel group 98 with vertical two-pixel sharing, arrayed two-dimensionally. The unit pixel group 98 is made up of the two photodiodes PD1 and PD2, two transfer transistors Tr11 and Tr12, and one reset transistor Tr2, amplifying transistor Tr3, and selection transistor Tr4.

According to the present embodiment, two pixels are configured each with a photodiode PD, a vertical transfer gate electrode 331 that surrounds the entire photodiode PD, and a floating diffusion portion FD that exists within the region corresponding to the photodiode PD. Each pixel 211 and 212 has the same configuration as the unit pixels described with the first and second embodiments, so portions corresponding to FIGS. 4 and 18 are denoted with the same reference numerals, and redundant description will be omitted. The two pixels 211 and 212 are formed in a 2 vertical×1 horizontal array. With the two pixels herein as one set, a reset transistor Tr2, amplifying transistor Tr3, and selection transistor Tr4 are arrayed to be shared on the lower side thereof.

The reset transistor Tr2 is made up of a pair of extrinsic semiconductor regions 37 and 38 serving as a source and drain, and a reset gate electrode 41. The amplifying transistor Tr3 is made up of a pair of extrinsic semiconductor regions 38 and 39 serving as a source and drain, and an amplifying gate electrode 42. The selection transistor Tr4 is made up of a pair of extrinsic semiconductor regions 39 and 40 serving as a source and drain, and a selection gate electrode 43.

The floating diffusion portion FD of the pixels 211 and 212 and the amplifying gate electrode 42 of the amplifying transistor Tr3 to be shared are connected by the line 62.

According to the solid-state imaging device 97 according to the fifth embodiment, even when the configuration is that of a solid-state imaging device to share between two pixels, similar to the above-described, a wide area can be realized for the photodiode PD, whereby saturation charge amount can be increased. Also, transfer efficiency of charge to the floating diffusion portion FD can be improved. Dark current is also suppressed.

According to the fifth embodiment, application has been made to a solid-state imaging device wherein sharing is realized between two pixels, but application may be made to a solid-state imaging device wherein sharing is realized between three or more pixels.

7. Sixth Embodiment

Configuration Example of Solid-State Imaging Device

Figure 25A:
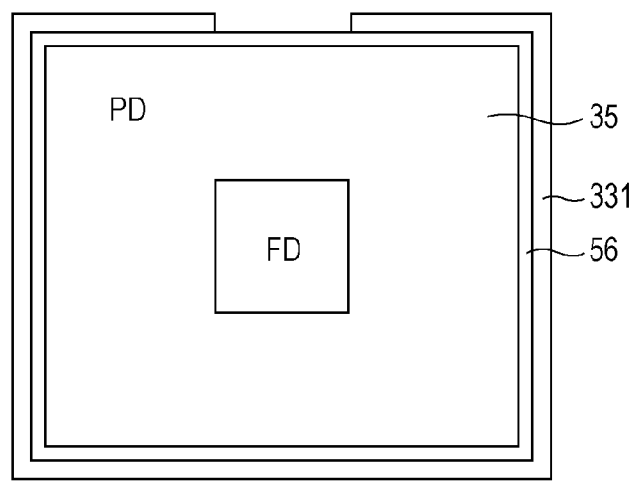
FIG. 25 is a schematic plan view of the primary portions of unit pixels illustrating a sixth embodiment of the solid-state imaging device according to the present invention.
Figure 25B:
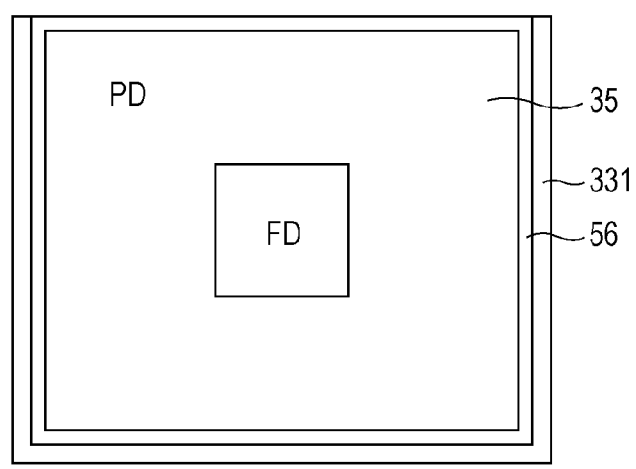
Figure 25C:
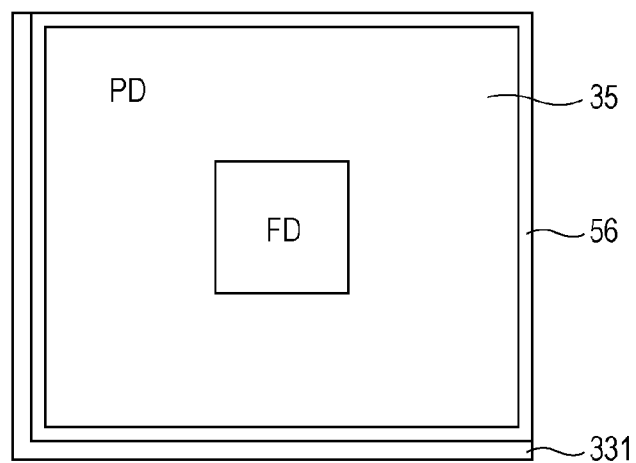

FIGS. 25A through 25C show a sixth embodiment of the solid-state imaging device relating to the present invention. FIGS. 25A through 25C show a layout example of a vertical transfer gate electrode surrounding a photodiode of a unit pixel. The vertical transfer gate electrode 331 according to the above-described embodiments has been formed so as to surround the entire periphery of the photodiode PD.

Conversely, according to the solid-state imaging device relating to the sixth embodiment, as shown in FIG. 25, the vertical transfer gate electrode 331 is formed so as to surround a portion of the photodiode PD instead of the entire periphery of the photodiode PD.

For example, the vertical transfer gate electrode 331 in FIG. 25A is formed so as to surround the periphery of the photodiode PD with a portion thereof non-continuous. The vertical transfer gate electrode 331 in FIG. 25B is formed so as to surround three sides of the periphery of the photodiode PD. The vertical transfer gate electrode 331 in FIG. 25C is formed so as to surround two sides of the periphery of the photodiode PD. The vertical transfer gate electrode 331 shown in FIGS. 25A through 25C are applicable to the solid-state imaging devices of the first through fifth embodiments. Accordingly, configurations other than the configuration shown in FIG. 25 are the same as those described with reference to the above-described first through fifth embodiments, so redundant description thereof will be omitted.

According to the solid-state imaging device relating to the sixth embodiment, a wide area can be realized for the photodiode PD, whereby saturation charge amount can be increased. Also, the vertical transfer gate electrode 331 is surrounding the photodiode PD except for a portion, although not surrounding the entire photodiode PD, whereby charge is transferred from multiple directions as to the floating diffusion portion FD. Also, transfer efficiency of charge can be improved as compared to charge transfer from one direction as it had been. Dark current is also suppressed.

8. Seventh Embodiment

Configuration Example of Solid-State Imaging Device

Figure 26:
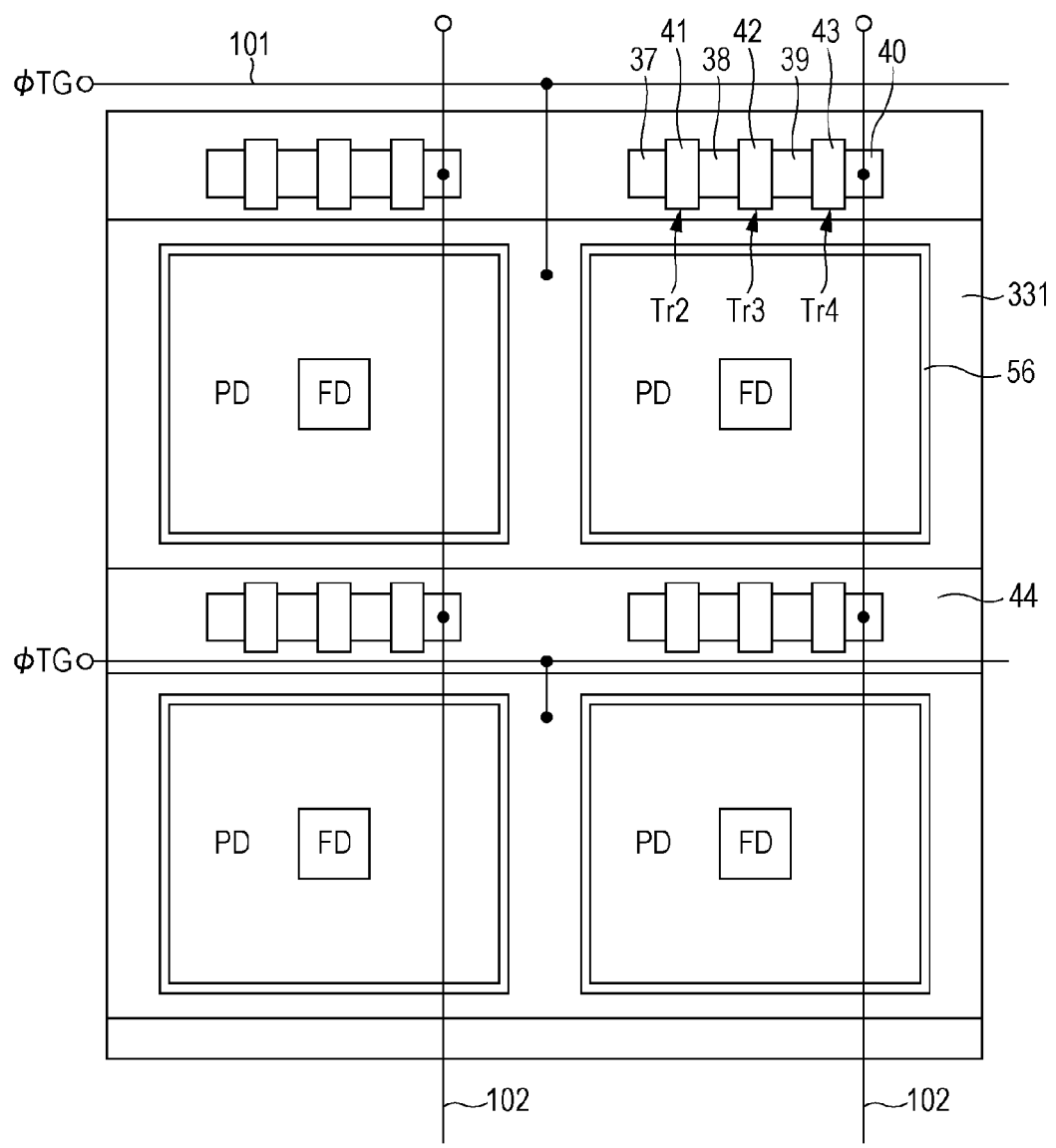
FIG. 26 is a schematic configuration diagram of the primary portions illustrating a seventh embodiment of the solid-state imaging device according to the present invention.

FIG. 26 shows a seventh embodiment of the solid-state imaging device relating to the present invention. The present embodiment is of a case of being applied to a CMOS solid-state imaging device, and FIG. 26 is a schematic plan view of the primary portions of the pixel region 3.

A solid-state imaging device 99 relating to the seventh embodiment is formed with a two-dimensional array of unit pixels 21 of the first embodiment, and continuously integrating the vertical transfer gate electrodes 331 of the unit pixels 21 for each pixel row in a horizontal line. That is to say, the groove 55 between the unit pixels 21 which are adjacent within the pixel row shown in FIG. 5 is completely filled in with the vertical transfer gate electrodes 331, according to the present embodiment. A transfer line 101 that applies a common transfer pulse φTG is connected to the vertical transfer gate electrodes 331 of the unit pixels 21 for each pixel row. Further, for each column, a common vertical signal line 102 is connected to the source region 40 of the selection transistor Tr4 of the unit pixel 21 within the column.

According to the present embodiment, although not shown in the diagram, multiple vertical transfer date electrodes in the vicinity can be shared. According to the present embodiment, adjacent vertical transfer gate electrodes in the pixel row in a horizontal line or multiple vertical transfer gate electrodes in the vicinity can be shared, and a device dividing region can be configured between the vertical transfer gate electrodes of the other adjacent pixels.

Other configurations are similar to that described with the first embodiment, so portions corresponding to FIG. 4 are denoted with the same reference numerals, and redundant description will be omitted.

According to the solid-state imaging device 99 relating to the seventh embodiment, when accumulating charge, negative bias voltage is applied to the vertical transfer gate electrodes 331, and hole pinning occurs in the channel region front face directly under the vertical transfer gate electrode 331. Dark current can be suppressed with the negative bias voltage. When reading out the charge, positive voltage is applied to the vertical transfer gate electrode 331 for each pixel row, and the transfer transistor Tr1 of each pixel 21 within one pixel row is turned on at the same time, and the charge accumulated in the photodiode PD of each pixel is transferred to each floating diffusion portion RD. The selection transistor Tr4 for each pixel within a vertical line of a pixel column is turned on, sequentially shifting the timing for each pixel column, and reading the charge of each pixel 21 of one pixel row sequentially to the vertical signal line 102.

According to the solid-state imaging device 99 relating to the seventh embodiment, similar to the above-described, even if the pixel size is reduced a wide area can be realized for the photodiode PD, whereby saturation charge amount can be increased. Also, transfer efficiency of charge to the floating diffusion portion FD can be improved. Dark current is also suppressed.

With the seventh embodiment, as a pixel configuration for example, that of the second through fifth embodiments can also be used.

9. Eighth Embodiment

Configuration Example of Solid-State Imaging Device

Figure 27:
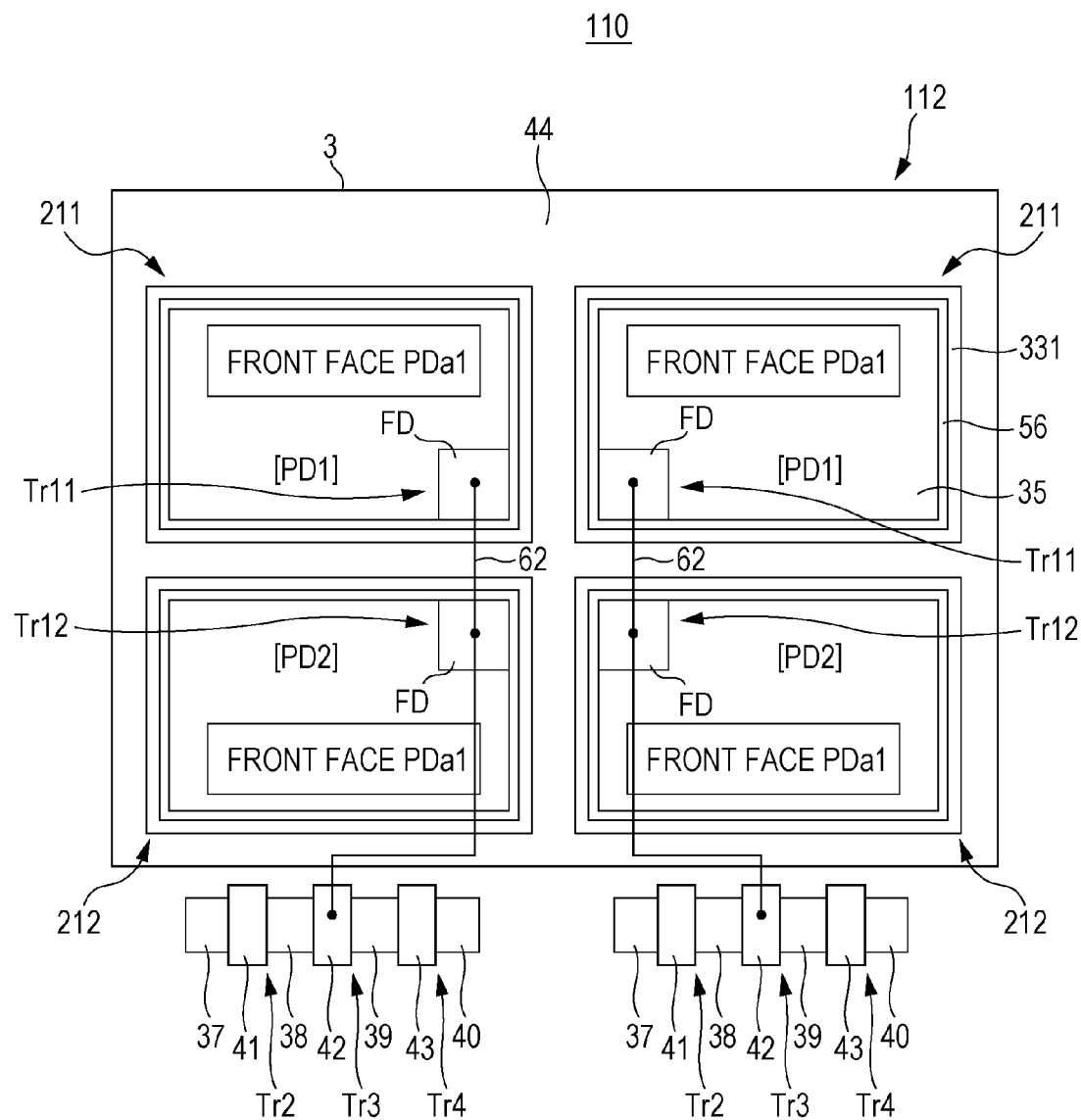
FIG. 27 is a schematic plan view of the primary portions illustrating an eighth embodiment of the solid-state imaging device according to the present invention.
Figure 28:
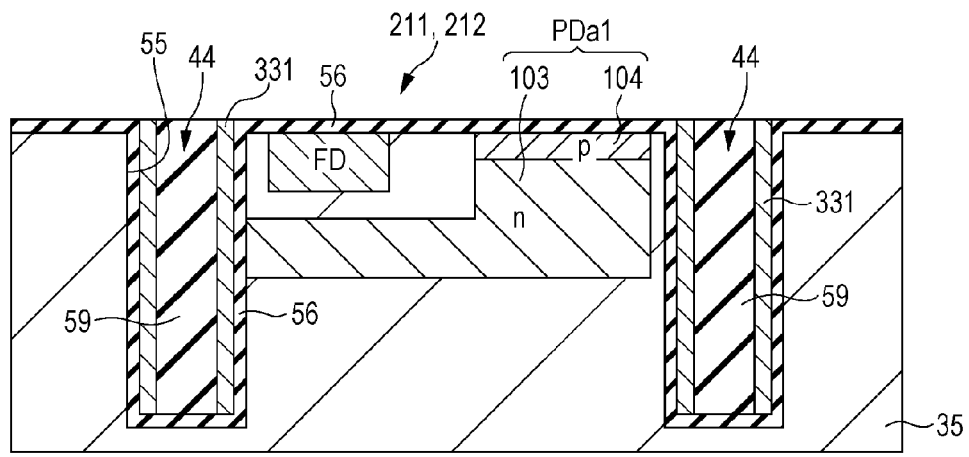
FIG. 28 is a schematic cross-sectional view of the primary portions in FIG. 27.

FIGS. 27 and 28 show an eighth embodiment of the solid-state imaging device relating to the present invention. The present embodiment is of a case of being applied to a CMOS solid-state imaging device, FIG. 27 is a schematic plan view of the primary portions of the pixel region 3, and FIG. 28 is a cross-sectional view of the pixel thereof.

A solid-state imaging device 110 relating to the eighth embodiment is formed with a two-dimensional array of a unit pixel group 112 sharing two vertical pixels wherein two photodiodes PD (PD1, PD2) share one pixel transistor, as shown in FIG. 27. The unit pixel group 112 is made up of two photodiodes PD1 and PD2, two transfer transistors Tr11 and Tr12, and one each of a reset transistor Tr2, amplifying transistor Tr3, and selection transistor Tr4.

According to the present embodiment, two pixels are configured each with a photodiode PD, a vertical transfer gate electrode 331 that surrounds the entire photodiode PD, and a floating diffusion portion FD that exists within the region corresponding to the photodiode PD. With the unit pixel group 112, a total of two pixels 211 and 214 are formed in a 2 vertical×1 horizontal array, each of eth photodiodes PD1 and PD2 are formed as a front face photodiode PDa1, and the floating diffusion portions FD re each disposed so as to be near the center thereof. With the two pixels 211 and 212 herein as one set, a reset transistor Tr2, amplifying transistor Tr3, and selection transistor Tr4 are arrayed to be shared on the lower side thereof.

The reset transistor Tr2 is made up of a pair of extrinsic semiconductor regions 37 and 38 serving as a source and drain, and a reset gate electrode 41. The amplifying transistor Tr3 is made up of a pair of extrinsic semiconductor regions 38 and 39 serving as a source and drain, and an amplifying gate electrode 42. The selection transistor Tr4 is made up of a pair of extrinsic semiconductor regions 39 and 40 serving as a source and drain, and a selection gate electrode 43. The floating diffusion portions FD of each pixel 211 and 212 and the amplifying date electrode 42 of the amplifying transistor Tr3 are connected by a line 62.

As shown in FIG. 28, for each pixel 211 and 212, a floating diffusion portion FD and a front face photodiode PDa1 is formed on the front face of the semiconductor substrate 35. The front face photodiode PDa1 is formed having a p-type semiconductor region 104 that is separated from the floating diffusion portion FD on the substrate front face, and a n-type semiconductor region 103 serving as the charge accumulating region extending below a portion of the floating diffusion portion FD. The floating diffusion portion FD exists within a region corresponding to the photodiode PDa1 when viewed from above.

A vertical transfer gate electrode 331 is formed so as to surround the front face photodiode PDa1 via an insulating film 56. A device dividing region 44 is formed between the mutual adjacent pixels 211 and 212. The device dividing region 44 is formed so as to fill in the groove 55 wherein the vertical transfer gate electrode 331 is formed.

According to the solid-state imaging device 110 relating to the eighth embodiment, even in the case of being configured as a two pixel sharing solid-state imaging device, similar to the above description, a wide area can be realized for the photodiode PD, whereby saturation charge amount can be increased. Also, transfer efficiency of charge to the floating diffusion portion FD can be improved. Dark current is also suppressed.

First Modification of Eighth Embodiment

Figure 29:
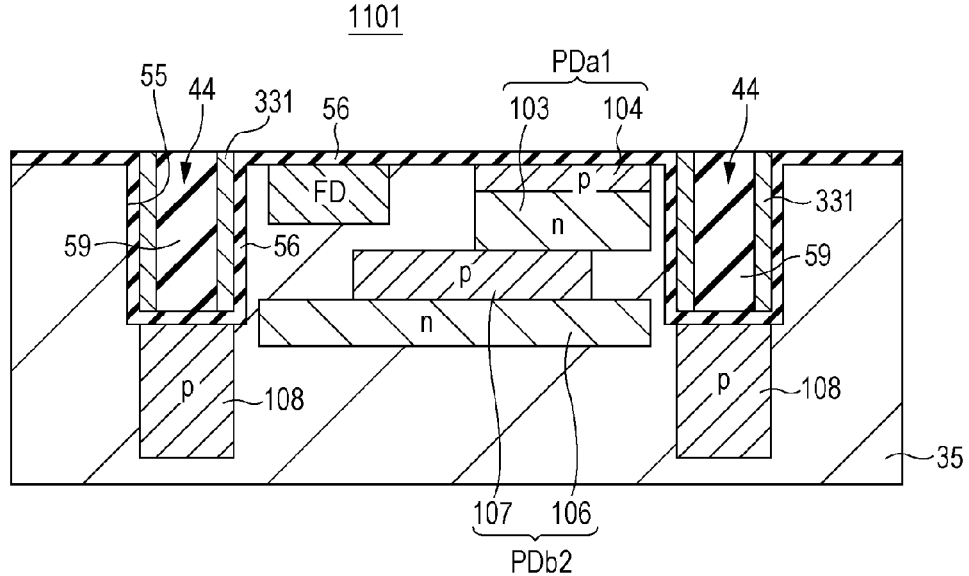
FIG. 29 is a schematic cross-sectional view of the primary portions illustrating a first modification of the eighth embodiment of the solid-state imaging device according to the present invention.

FIG. 29 shows a solid-state imaging device relating to a first modification of the eighth embodiment. Similar to FIG. 27, a solid-state imaging device 1101 relating to the first modification is configured with a two pixel sharing method of a 2 vertical×1 horizontal array. The solid state imaging device 1101 is formed with a floating diffusion portion FD and a front face photodiode PDa1 on the front face of the semiconductor substrate 35 of each pixel 211 and 212, and an embedded photodiode PDb2 is formed under the front face photodiode PDa1. The front face photodiode PDa1 is formed of a n-type semiconductor region 103 and p-type semiconductor region 104. The embedded photodiode PDb2 is formed with a p-type semiconductor region 107 that is adjacent to the n-type semiconductor region 103 of the front face photodiode PDa1 and an n-type semiconductor region 106. The n-type semiconductor region 106 is formed so as to extend toward the vertical transfer gate electrode 331. A p-type semiconductor well region 108 serving as a device dividing region is formed below the region that includes the vertical transfer gate electrode 331 and the device dividing region 44. The floating diffusion portion FD exists within a region corresponding to the photodiode PDb2 when viewed from above. Other configurations are similar to that described in FIGS. 27 and 28, so portions in FIG. 29 which correspond to portions in FIG. 28 are denoted with the same reference numerals, and redundant description will be omitted.

The solid-state imaging device 1101 is configured to be shared between two pixels, and when accumulating charge, signal charge is accumulated in the n-type semiconductor region 103 of the front face photodiode PDa1 of each pixel 211 and 212 and the n-type semiconductor region 106 of the embedded photodiode PDb2. A transfer pulse $\phi TG$ is applied to the vertical transfer gate electrode 331 of the selected pixel at the time of charge readout, whereby the vertical transfer transistor is turned on. By the vertical transfer transistor having been turned on, the charge accumulated in the front face photodiode PDa1 and the embedded photodiode PDb1 is transferred to the floating diffusion portion FD through the channel region below the vertical transfer gate electrode 331. When accumulating charge, negative bias voltage is applied to both transfer gate electrodes 331 and 332, and hole pinning occurs.

According to the solid-state imaging device 1101, similar to the above-described, even if the pixel size is reduced a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

Second Modification of Eighth Embodiment

Figure 30:
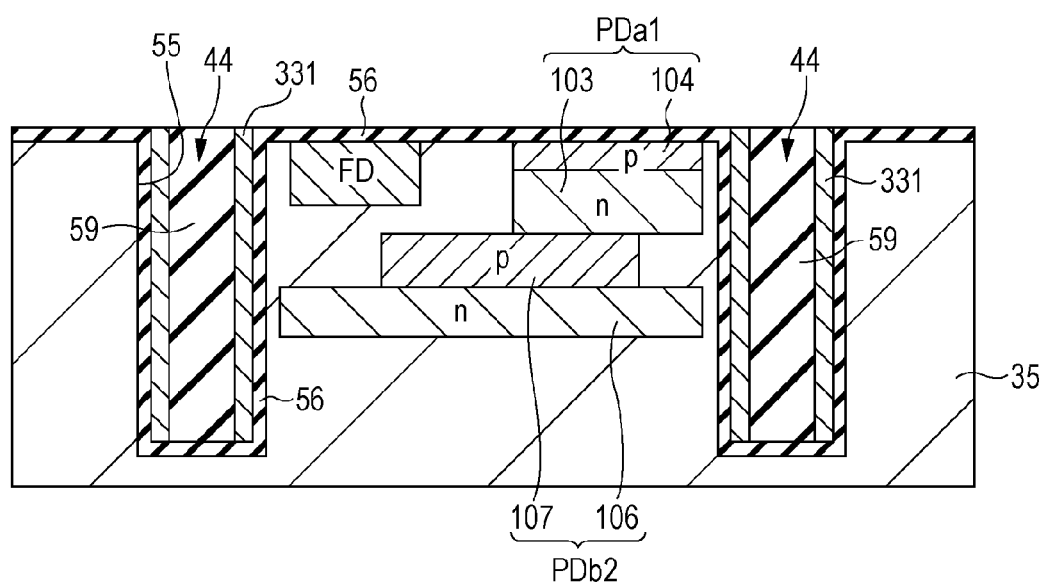
FIG. 30 is a schematic cross-sectional view of the primary portions illustrating a second modification of the eighth embodiment of the solid-state imaging device according to the present invention.

FIG. 30 shows a solid-state imaging device relating to a second modification of the eighth embodiment. The difference between the first modification and the second modification is in the point that the vertical transfer gate electrode 331 is formed to the depth of the embedded photodiode PDb2. That is to say, the solid-state imaging device 102 relating to the second modification is formed with a floating diffusion portion FD on the front face of the semiconductor substrate 35 of each pixel and a front face photodiode PDa1, and an embedded photodiode PDb2 is formed under the front face photodiode PDa1. The front face photodiode PDa1 is formed of a n-type semiconductor region 103 and p-type semiconductor region 104. The embedded photodiode PDb2 is formed with a p-type semiconductor region 107 that is adjacent to the n-type semiconductor region 103 of the front face photodiode PDa1 and an n-type semiconductor region 106. The n-type semiconductor region 106 is formed so as to extend toward the vertical transfer gate electrode 331. The vertical transfer gate electrode 331 is formed to the depth of exceeding the embedded photodiode PD2. The floating diffusion portion FD exists within a region corresponding to the photodiode PDb2 when viewed from above. Other configurations are similar to that described in FIGS. 27 and 28, so portions in FIG. 30 corresponding in portions in FIG. 29 are denoted with the same reference numerals, and redundant description will be omitted.

The operations of the solid-state imaging device 1102 are similar to that in FIG. 29.

According to the solid-state imaging device 1102, similar to the above-described, even if the pixel size is reduced a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

10. Ninth Embodiment

Configuration Example of Solid-State Imaging Device

Figure 31:
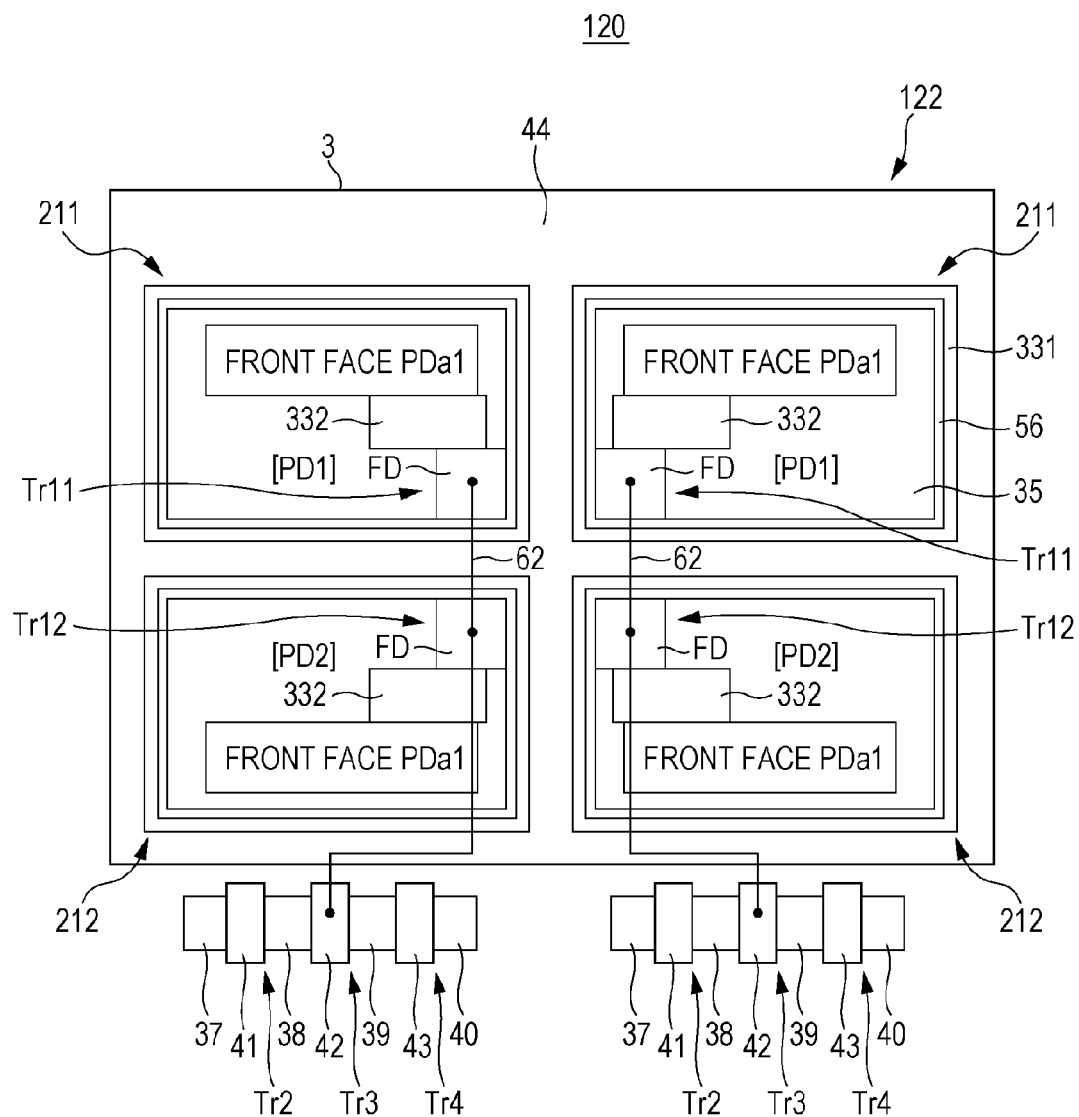
FIG. 31 is a schematic plan view of the primary portions illustrating an ninth embodiment of the solid-state imaging device according to the present invention.
Figure 32:
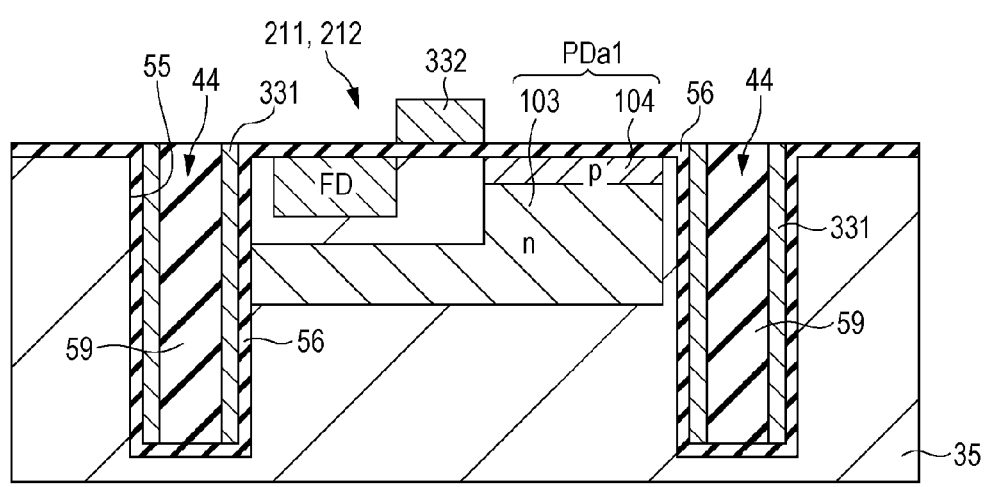
FIG. 32 is a schematic cross-sectional view of the primary portions in FIG. 31.

FIGS. 31 and 32 show a ninth embodiment of the solid-state imaging device relating to the present invention. The present embodiment is of a case of being applied to a CMOS solid-state imaging device. FIG. 31 is a schematic plan view of the primary portions of the pixel region 3, and FIG. 32 is the cross-sectional view of the pixel.

A solid-state imaging device 120 relating to the ninth embodiment is formed with a two-dimensional array of a unit pixel group 112 of two shared vertical pixels wherein two photodiodes PD (PD1, PD2) share one pixel transistor, as shown in FIG. 31. The unit pixel group 122 is made up of two photodiodes PD1 and PD2, two transfer transistors Tr11 and Tr12, and one each of a reset transistor Tr2, amplifying transistor Tr3, and selection transistor Tr4.

According to the present embodiment, two pixels are configured each with a photodiode PD, a vertical transfer gate electrode 331 that surrounds the entire photodiode PD, and a floating diffusion portion FD of a region corresponding to the photodiode PD. With the unit pixel group 122, a total of two pixels 211 and 212 are formed in a 2 vertical×1 horizontal array, each of the photodiodes PD1 and PD2 are formed as a front face photodiode PDa1, and the floating diffusion portions FD are each disposed so as to be near the center thereof. Also, a front face transfer gate electrode 332 is formed between the front face photodiode PDa1 and floating diffusion portion FD. With the two pixels 211 and 212 herein as one set, a reset transistor Tr2, amplifying transistor Tr3, and selection transistor Tr4 are arrayed to be shared on the lower side thereof.

The reset transistor Tr2 is made up of a pair of extrinsic semiconductor regions 37 and 38 serving as a source and drain, and a reset gate electrode 41. The amplifying transistor Tr3 is made up of a pair of extrinsic semiconductor regions 38 and 39 serving as a source and drain, and an amplifying gate electrode 42. The selection transistor Tr4 is made up of a pair of extrinsic semiconductor regions 39 and 40 serving as a source and drain, and a selection gate electrode 43. The floating diffusion portions FD of each pixel 211 through 214 and the amplifying gate electrode 42 of the amplifying transistor Tr3 are connected by a line 62.

As shown in FIG. 32, for each pixel 211 and 212, a floating diffusion portion FD and a front face photodiode PDa1 are formed on the front face of the semiconductor substrate 35. The front face photodiode PDa1 is formed having a p-type semiconductor region 104 that is separated from the floating diffusion portion FD on the substrate front face, and an n-type semiconductor region 103 serving as the charge accumulating region extending below a portion of the floating diffusion portion FD. The floating diffusion portion FD exists within a region corresponding to the photodiode PDa1 when viewed from above.

A vertical terminal gate electrode 331 is formed so as to surround the front face photodiode PDa1 via an insulating film 56, and a horizontal transfer gate electrode is formed between the front face photodiode PDa1 and floating diffusion portion FD via the gate insulating film 56. The vertical transfer gate electrode 331 and horizontal transfer gate electrode 332 that are formed to be mutually separated are electrically connected, though not shown in the diagram. A device dividing region 44 is formed between the mutual adjacent pixels 211 and 212. The device dividing region 44 is formed so as to fill in the groove 55 wherein the vertical transfer gate electrode 331 is formed.

According to the solid-state imaging device 120 relating to the ninth embodiment, a transfer pulse $\phi TG$ is applied simultaneously to the vertical transfer gate electrode 331 and horizontal transfer gate electrode 332 at the time of charge readout, and the transfer transistor is turned on. By the transfer transistor having been turned on, the charge accumulated in the n-type semiconductor region 103, which is a charge accumulating region, is transferred to the floating diffusion portion FD through the channel region below the vertical transfer gate electrode 331 and the channel region below the horizontal transfer gate electrode 332. When accumulating charge, negative bias voltage is applied to both transfer gate electrodes 331 and 332, and hole pinning occurs.

According to the solid-state imaging device 120 relating to the ninth embodiment, similar to the above description, even if the pixel size is reduced a wide area can be realized for the photodiode PD, whereby saturation charge amount can be increased. Also, transfer efficiency of charge to the floating diffusion portion FD can be improved. Dark current is also suppressed.

First Modification of Ninth Embodiment

Figure 33:
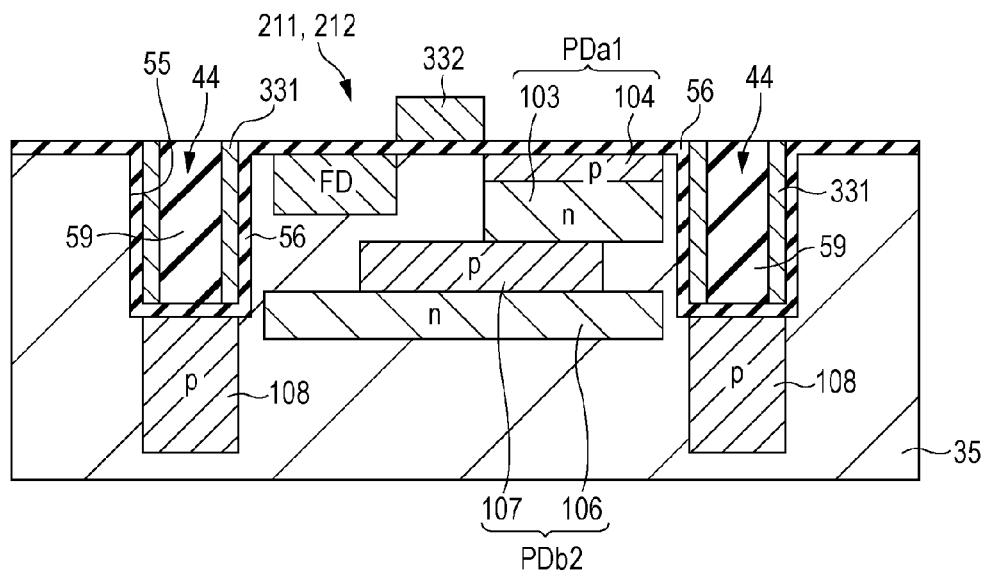
FIG. 33 is a schematic plan view of the primary portions illustrating a first modification of the ninth embodiment of the solid-state imaging device according to the present invention.

FIG. 33 shows a solid-state imaging device relating to the first modification of the ninth embodiment. Similar to FIG. 31, a solid-state imaging device 1201 relating to the first modification is configured with a two pixel sharing method of a 2 vertical×1 horizontal array. The solid state imaging device 1201 is formed with a floating diffusion portion FD and a front face photodiode PDa1 on the front face of the semiconductor substrate 35 of each pixel 211 and 212, and an embedded photodiode PDb2 is formed under the front face photodiode PDa1. The front face photodiode PDa1 is formed with an n-type semiconductor region 103 and a p-type semiconductor region 104. The embedded photodiode PDb2 is formed with a p-type semiconductor region 107 that is adjacent to the n-type semiconductor region 103 of the front face photodiode PDa1 and an n-type semiconductor region 106. The n-type semiconductor region 106 is formed so as to extend toward the vertical transfer gate electrode 331. A p-type semiconductor well region 108 serving as a device dividing region is formed below the region that includes the vertical transfer gate electrode 331 and the device dividing region 44. The floating diffusion portion FD exists within a region corresponding to the photodiode PDb2 when viewed from above. Other configurations are similar to that described in FIGS. 31 and 32, so portions in FIG. 33 corresponding to portions in FIG. 32 are denoted with the same reference numerals, and redundant description will be omitted.

The solid-state imaging device 1201 is configured to be shared between two pixels, and when accumulating charge, signal charge is accumulated in the n-type semiconductor region 103 of the front face photodiode PDa1 of each pixel 211 and 212 and the n-type semiconductor region 106 of the embedded photodiode PDb2. A transfer pulse φTG is applied simultaneously to the vertical transfer gate electrode 331 and the horizontal transfer gate electrode 332 at the time of charge readout, and the transfer transistor is turned on. By the transfer transistor having been turned on, the charge accumulated in the front face photodiode PDa1 and the embedded photodiode PDb2 is transferred to the floating diffusion portion FD primarily through the channel region below the horizontal transfer gate electrode 332. The charge accumulated in the embedded photodiode PDb2 is transferred to the floating diffusion portion FD through the channel region below the vertical transfer gate electrode 331. When accumulating charge, negative bias voltage is applied to both transfer gate electrodes 331 and 332, and hole pinning occurs.

According to the solid-state imaging device 1201, similar to the above-described, even if the pixel size is reduced a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

Second Modification of Ninth Embodiment

Figure 34:
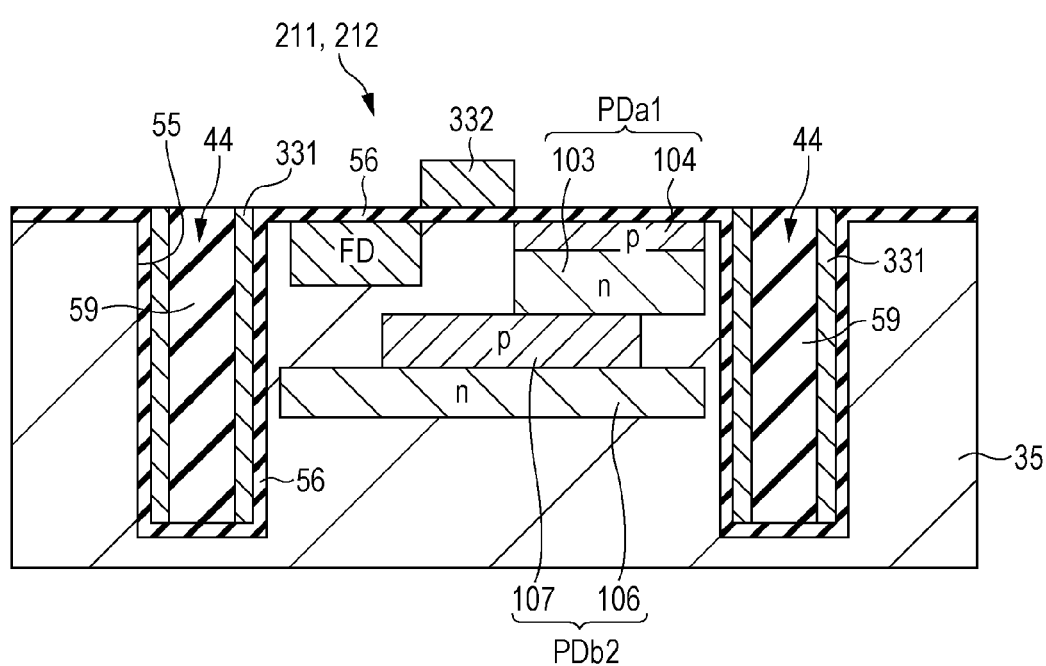
FIG. 34 is a schematic plan view of the primary portions illustrating a second modification of the ninth embodiment of the solid-state imaging device according to the present invention.

FIG. 34 shows a solid-state imaging device relating to the second modification of the ninth embodiment. The second modification differs from the first modification in the point that the vertical transfer gate electrode 331 is formed to the depth of the embedded photodiode PDb2. That is to say, a solid-state imaging device 1202 relating to the second modification is formed with a floating diffusion portion FD and a front face photodiode PDa1 on the front face of the semiconductor substrate 35 of each pixel, and an embedded photodiode PDb2 are formed under the front face photodiode PDa1. The front face photodiode PDa1 is formed with an n-type semiconductor region 103 and a p-type semiconductor region 104. The embedded photodiode PDb2 is formed with a p-type semiconductor region 107 that is adjacent to the n-type semiconductor region 103 of the front face photodiode PDa1 and an n-type semiconductor region 106. The n-type semiconductor region 106 is formed so as to extend toward the vertical transfer gate electrode 331. The vertical transfer gate electrode 331 is formed to a depth exceeding the embedded photodiode PD2. The floating diffusion portion FD exists within a region corresponding to the photodiode PDb2 when viewed from above. Other configurations are similar to that described in FIGS. 31 and 33, so portions in FIG. 34 corresponding to portions in FIG. 33 are denoted with the same reference numerals, and redundant description will be omitted.

Operations of the solid-state imaging device 1202 are similar to the descriptions of those in the comparison example (1) in FIG. 32.

According to the solid-state imaging device 1202, similar to the above-described, even if the pixel size is reduced a wide area can be realized for the photodiode PD, and an embedded PDb2 is below the front face photodiode PDa1, whereby saturation charge amount can be increased. Also, transfer efficiency of charge to the floating diffusion portion FD can be improved. Dark current is also suppressed.

According to the eighth and ninth embodiments, application has been made to a solid-state imaging device wherein sharing is realized between two pixels, but application may be made to a solid-state imaging device wherein sharing is realized between three or more pixels.

Note that the pixels 211 and 212 shown in FIGS. 27 and 31 can be configured as unit pixels instead of a pixel sharing configuration. That is to say, the layout of each pixel 211 and 212 can be maintained, and the CMOS solid-state imaging device configured with each pixel 21 as a unit pixel.

11. Tenth Embodiment

Configuration Example of Solid-State Imaging Device

The solid-state imaging device according to a tenth embodiment, although not shown in the diagrams, is configured with multiple, for example two, semiconductor chip portions, adhered together to form an integrated semiconductor chip. To describe in more detail, with the solid-state imaging device according to the present embodiment, a pixel region wherein unit pixels or unit pixel groups arrayed two-dimensionally that have been formed according to one of the above-described embodiments is formed on a first semiconductor ship portion, for example. That is to say, a sensor and a pixel transistor are formed on the first semiconductor chip portion. A control circuit, driving circuit, signal processing circuit and so forth are formed on a second semiconductor chip portion. These first and second semiconductor chip portions are adhered and formed together so as to be electrically connected.

Further, a configuration may be made wherein only the photodiodes and transfer transistors formed according to one of the above-described embodiments are formed on the first semiconductor chip portion, and the other pixel transistors, control circuit, driving circuit, signal processing circuit and so forth are formed on the second semiconductor chip portion.

According to the solid-state imaging device of to the tenth embodiment, with the unit pixels and unit pixel groups, similar to the above-described, saturated charge amount can be increased, charge transfer efficiency to the floating diffusion portion improved, and dark current suppressed. Further, with a configuration wherein multiple, for example two, semiconductor chip portions are adhered together, the sensor portions and other circuit configurations can be assigned to each of the semiconductor chip portions, whereby the solid-state imaging device can be configured under optimal conditions. That is to say, a solid-state imaging device with high performance can be configured.

12. Eleventh Embodiment

Configuration Example of Electronic Equipment

The solid-state imaging device relating to embodiments of the present invention described above can be applied to electronic devices such as camera systems such as a digital camera, video camera, or the like, a cellular telephone having an imaging function, or other devices having imaging functions.

Figure 35:
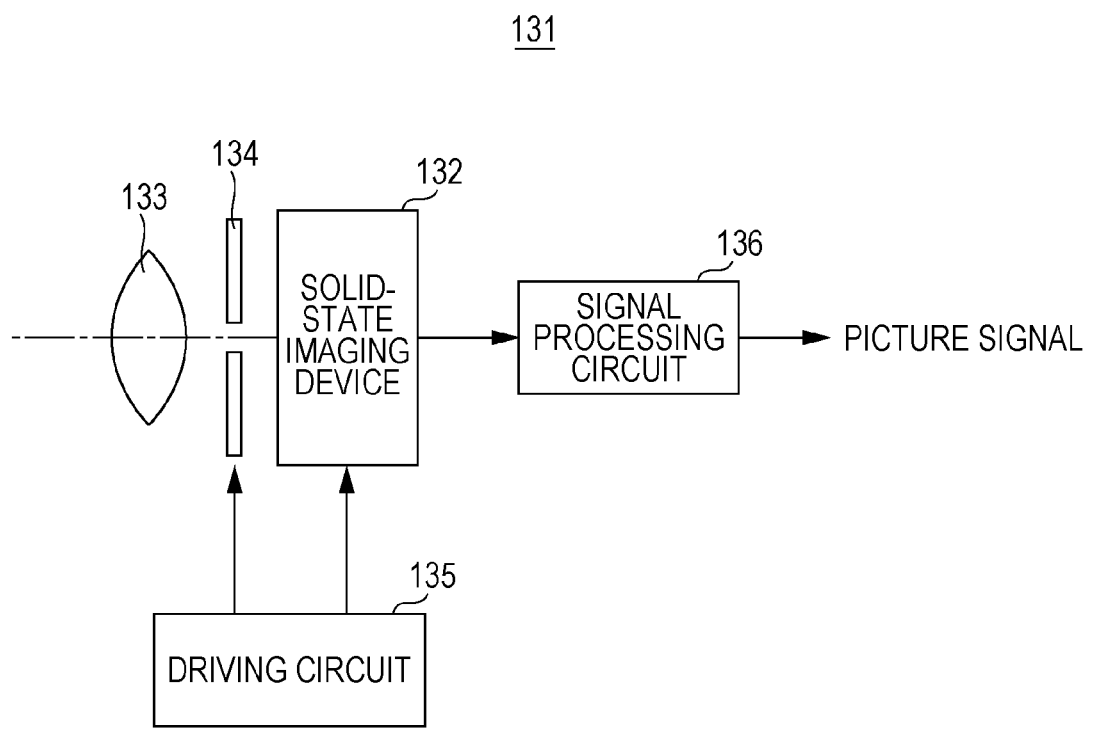
FIG. 35 is a schematic configuration diagram of electronic equipment relating to an eleventh embodiment according to the present invention.

FIG. 35 shows an eleventh embodiment applied to a camera as an example of the electronic equipment relating to an embodiment of the present invention. The camera relating to the present embodiment exemplifies a video camera that can shoot still images or moving images. A camera 131 according to the present embodiment has a solid-state imaging device 132, an optical system 133 that guides incident light into a light-receiving sensor portion of the solid-state imaging device 132, and a shutter device 134. Further, the camera 131 has a driving circuit 135 that drives the solid-state imaging device 132 and a signal processing circuit 136 that processes the output signals of the solid-state imaging device 132.

A solid-state imaging device according to one of the above-described embodiments is used for the solid-state imaging device 132. The optical system (optical lens) 133 forms an image, from the image light (incident light) from the subject, upon the imaging face of the solid-state imaging device 132. Thus, signal charge is accumulated within the solid-state imaging device 132 for a fixed period. The optical system 133 may be an optical lens system made up of multiple optical lenses. The shutter device 134 controls a light illumination period and a light blocking period to the solid-state imaging device 132. The driving circuit 135 supplies a driving signal to control the transfer operations of the solid-state imaging device 132 and the shutter operations of the shutter device 134. With the driving signal (timing signal) supplied from the driving circuit 135, the signal transfer of the solid-state imaging device 132 is performed. The signal processing circuit 136 performs various types of signal processing. The video signal wherein signal processing is performed is stored in a storage medium such as memory, or is output to a monitor.

According to the electronic equipment such as a camera relating to the eleventh embodiment, with the solid-state imaging device 122, even if the pixel size is reduced the saturation charge amount can be increased, charge transfer efficiency to the floating diffusion portion improved, and further, dark current can be suppressed. Accordingly, high sensitivity and high image quality can be obtained, and electronic equipment with high reliability can be provided.

The present application contains subject matter related to that disclosed in Japanese Priority Patent Application JP 2010-019598 filed in the Japan Patent Office on Jan. 29, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels formed of photoelectric converters and pixel transistors, wherein each pixel of the plurality of pixels includes one or more photoelectric converters;
a floating diffusion portion that exists within a region above at least one of the one or more photoelectric converters;
a transfer transistor comprising a transfer gate electrode, the transfer gate electrode comprising a vertical transfer gate electrode formed in a depth direction of a substrate and a horizontal transfer gate electrode, wherein the vertical transfer gate electrode of the transfer transistor surrounds the one or more photoelectric converters in the depth direction of the substrate and wherein the vertical transfer gate electrode and the horizontal transfer gate electrode form a transfer gate having an L-shaped cross-sectional shape; and
a device dividing region comprising an insulation layer formed between the L-shaped transfer gate electrodes of adjacent pixels, wherein the transfer gate electrode is divided for each unit pixel of the plurality of pixels.

2. The solid-state imaging device according to claim 1, further comprising:
a plurality of said photoelectric converters in the depth direction of the substrate.

3. The solid-state imaging device according to claim 2, wherein said floating diffusion portion is formed in the center of the region of said photoelectric converters as seen from above.

4. The solid-state imaging device according to claim 3, further comprising:
a horizontal gate electrode that extends from said vertical transfer gate electrode to the substrate front face.

5. The solid-state imaging device according to claim 1, further comprising:
said photoelectric converters on the substrate front face.

6. The solid-state imaging device according to claim 1, wherein negative bias voltage is applied to said vertical transfer gate electrode at time of charge accumulation.

7. A driving method of a solid-state imaging device, said solid-state imaging device comprising:
a plurality of pixels formed of photoelectric converters and pixel transistors, wherein each pixel of the plurality of pixels includes one or more photoelectric converters;
a floating diffusion portion that exists within a region above at least one of the one or more photoelectric converters;
a transfer transistor comprising a transfer gate electrode, the transfer gate electrode comprising a vertical transfer gate electrode formed in a depth direction of a substrate and a horizontal transfer gate electrode, wherein the vertical transfer gate electrode of the transfer transistor surrounds the one or more photoelectric converters in the depth direction of the substrate and wherein the vertical transfer gate electrode and the horizontal transfer gate electrode form a transfer gate having an L-shaped cross-sectional shape;
a device dividing region comprising an insulation layer formed between the L-shaped transfer gate electrodes of adjacent pixels, wherein the vertical transfer gate electrodes are divided for each unit pixel of the plurality of pixels;
wherein negative bias voltage is applied to said vertical transfer gate electrode when accumulating charge; and
wherein positive bias voltage is applied to said vertical transfer gate electrode at the time of charge transfer.

8. Electronic equipment comprising:
a solid-state imaging device;
an optical system to guide incident light to a photodiode of said solid-state imaging device; and
a signal processing circuit to process output signals from said solid-state imaging device;
wherein said solid-state imaging device is configured of the solid-state imaging device according to claim 1.

9. The solid-state imaging device according to claim 1, further comprising:
a horizontal transfer gate electrode formed on a front face of the substrate via a gate insulating film.

10. The solid-state imaging device according to claim 9, wherein a gap in the horizontal transfer gate electrode occurs above the floating diffusion portion.

11. The driving method of a solid-state imaging device according to claim 7, further comprising:

a horizontal transfer gate electrode formed on a front face of the substrate via a gate insulating film, wherein a gap in the horizontal transfer gate electrode occurs above the floating diffusion portion.

12. The solid-state imaging device according to claim 1, wherein the horizontal transfer gate electrode includes an opening formed above the region such that the horizontal transfer gate electrode does not cover at least a portion of the floating diffusion portion.

13. The driving method of a solid-state imaging device according to claim 7, wherein the horizontal transfer gate electrode includes an opening formed above the region such that the horizontal transfer gate electrode does not cover at least a portion of the floating diffusion portion.

* * * * *